(12) United States Patent
Saito et al.

(10) Patent No.: US 8,711,623 B2
(45) Date of Patent: *Apr. 29, 2014

(54) MEMORY DEVICE AND SEMICONDUCTOR DEVICE

(71) Applicant: Semiconductor Energy Laboratory Co., Ltd, Atsugi (JP)

(72) Inventors: Toshihiko Saito, Kanagawa (JP); Shuhei Nagatsuka, Kanagawa (JP)

(73) Assignee: Semicondoctor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,871

(22) Filed: Mar. 22, 2013

(65) Prior Publication Data

US 2013/0223157 A1 Aug. 29, 2013

Related U.S. Application Data

(63) Continuation of application No. 13/044,656, filed on Mar. 10, 2011, now Pat. No. 8,422,298.

(30) Foreign Application Priority Data

Mar. 17, 2010 (JP) ................................ 2010-060393

(51) Int. Cl.
*G11C 14/00* (2006.01)
*G11C 16/04* (2006.01)

(52) U.S. Cl.
USPC ............... 365/185.08; 365/185.2; 365/189.2; 365/189.07

(58) Field of Classification Search
USPC .......................................... 365/185.08, 189.2
See application file for complete search history.

(56) References Cited

U.S. PATENT DOCUMENTS

| 4,466,081 A | 8/1984 | Masuoka |
| 5,349,366 A | 9/1994 | Yamazaki et al. |

(Continued)

FOREIGN PATENT DOCUMENTS

| EP | 1 737 044 A1 | 12/2006 |
| EP | 2 141 744 A1 | 1/2010 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

(Continued)

*Primary Examiner* — Tan T. Nguyen
(74) *Attorney, Agent, or Firm* — Fish & Richardson P.C.

(57) ABSTRACT

One of objects is to provide a nonvolatile memory device in which the occurrence of a defect in data writing is suppressed and whose area can be suppressed, or a semiconductor device including the nonvolatile memory device. A first memory portion including a nonvolatile memory element and a second memory portion (data buffer) for temporarily storing data in verifying operation in which whether the data is correctly written into the first memory portion is verified are provided. Further, the second memory portion includes a memory element and an insulated gate field effect transistor for controlling the holding of charge in the memory element; the off-state current or the leakage current of the transistor is extremely low.

22 Claims, 16 Drawing Sheets

(56) References Cited

U.S. PATENT DOCUMENTS

| | | |
|---|---|---|
| 5,657,270 A | 8/1997 | Ohuchi et al. |
| 5,731,856 A | 3/1998 | Kim et al. |
| 5,744,864 A | 4/1998 | Cillessen et al. |
| 5,831,903 A | 11/1998 | Ohuchi et al. |
| 6,081,454 A | 6/2000 | Ohuchi et al. |
| 6,118,703 A | 9/2000 | Hamaguchi |
| 6,127,702 A | 10/2000 | Yamazaki et al. |
| 6,294,274 B1 | 9/2001 | Kawazoe et al. |
| 6,563,174 B2 | 5/2003 | Kawasaki et al. |
| 6,646,922 B2 | 11/2003 | Kato |
| 6,727,522 B1 | 4/2004 | Kawasaki et al. |
| 6,768,680 B2 | 7/2004 | Kato |
| 6,839,260 B2 | 1/2005 | Ishii |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,177,187 B2 | 2/2007 | Ishii |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,336,519 B2 | 2/2008 | Ishii |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,508,706 B2 | 3/2009 | Tsuruda |
| 7,570,516 B2 | 8/2009 | Ishii |
| 7,623,391 B1 | 11/2009 | Wong et al. |
| 7,674,650 B2 | 3/2010 | Akimoto et al. |
| 7,714,633 B2 | 5/2010 | Kato |
| 7,719,872 B2 | 5/2010 | Kato |
| 7,732,819 B2 | 6/2010 | Akimoto et al. |
| 7,764,551 B2 | 7/2010 | Seo et al. |
| 7,791,074 B2 | 9/2010 | Iwasaki |
| 7,796,440 B2 | 9/2010 | Lee |
| 7,826,266 B2 | 11/2010 | Ishii |
| 7,830,732 B2 | 11/2010 | Moshayedi et al. |
| 7,863,611 B2 | 1/2011 | Abe et al. |
| 7,916,538 B2 * | 3/2011 | Jeon et al. ............... 365/185.05 |
| 7,940,582 B2 * | 5/2011 | Fekih-Romdhane ......... 365/200 |
| 8,314,637 B2 | 11/2012 | Kato et al. |
| 8,395,938 B2 * | 3/2013 | Yamazaki et al. ....... 365/185.08 |
| 8,422,298 B2 * | 4/2013 | Saito et al. ............... 365/185.18 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0147278 A1 | 8/2003 | Tanaka et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272759 A1 | 11/2007 | Kato |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0106938 A1 | 5/2008 | Ishii |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0205139 A1 | 8/2008 | Futatsuyama |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0040836 A1 | 2/2009 | Lee |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321732 A1 | 12/2009 | Kim et al. |
| 2010/0044699 A1 | 2/2010 | Chung et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0148845 A1 | 6/2010 | Kato |
| 2010/0193785 A1 | 8/2010 | Kimura |
| 2010/0203673 A1 | 8/2010 | Hayashi et al. |
| 2010/0276689 A1 | 11/2010 | Iwasaki |
| 2010/0279462 A1 | 11/2010 | Iwasaki |
| 2011/0024741 A1 | 2/2011 | Abe et al. |
| 2011/0101351 A1 | 5/2011 | Yamazaki |
| 2011/0187410 A1 | 8/2011 | Kato et al. |

FOREIGN PATENT DOCUMENTS

| | | |
|---|---|---|
| EP | 2 157 616 A1 | 2/2010 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | | |
|---|---|---|---|
| JP | 63-265818 A | 11/1988 | |
| JP | 05-251705 A | 9/1993 | |
| JP | 06-021478 A | 1/1994 | |
| JP | 08-264794 A | 10/1996 | |
| JP | 11-505377 A | 5/1999 | |
| JP | 11-306770 A | 11/1999 | |
| JP | 2000-044236 A | 2/2000 | |
| JP | 2000-150900 A | 5/2000 | |
| JP | 2001-148460 A | 5/2001 | |
| JP | 03221437 B2 | 10/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003-298062 A | 10/2003 | |
| JP | 2004-103957 A | 4/2004 | |
| JP | 2004-273614 A | 9/2004 | |
| JP | 2004-273732 A | 9/2004 | |
| JP | 2005-322899 A | 11/2005 | |
| JP | 2006-165532 A | 6/2006 | |
| JP | 2007-122758 A | 5/2007 | |
| JP | 2009-043397 A | 2/2009 | |
| JP | 2009-260364 A | 11/2009 | |
| JP | 2010-016347 A | 1/2010 | |
| JP | 2010-033637 A | 2/2010 | |
| JP | 2010-050434 A | 3/2010 | |
| KR | 2009-0015645 A | 2/2009 | |
| KR | 2010-0002503 A | 1/2010 | |
| KR | 2010-0023151 A | 3/2010 | |
| WO | 2004/114391 A1 | 12/2004 | |

OTHER PUBLICATIONS

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

International Search Report (PCT Application No. PCT/JP2011/054415) dated May 31, 2011, in English.

Written Opinion (PCT Application No. PCT/JP2011/054415) dated May 31, 2011, in English.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of Zno Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

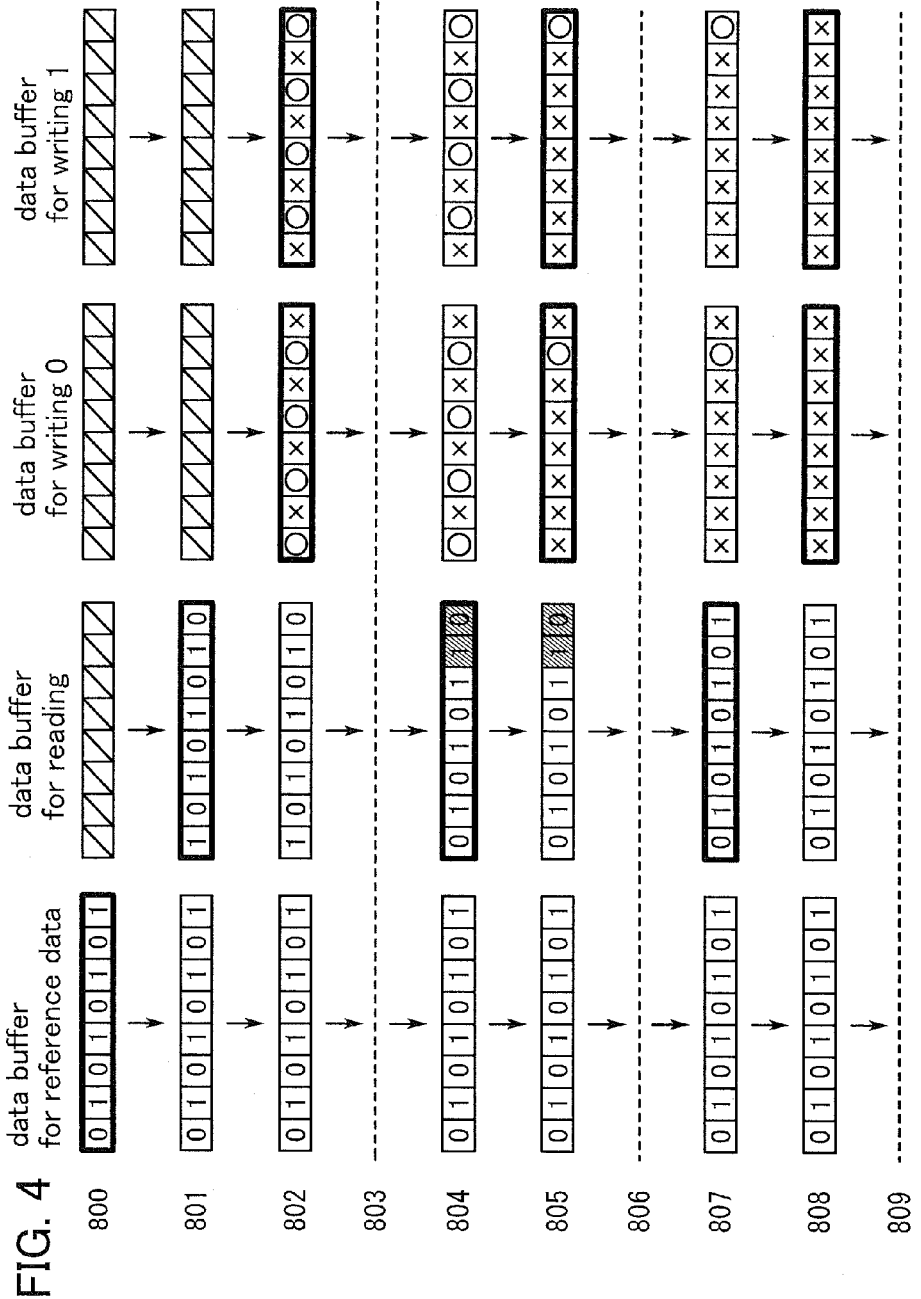

US 8,711,623 B2

MEMORY DEVICE AND SEMICONDUCTOR DEVICE

CROSS-REFERENCE TO RELATED APPLICATIONS

This application is a continuation of U.S. application Ser. No. 13/044,656, filed Mar. 10, 2011, as U.S. Pat. No. 8,422,298, which claims the benefit of a foreign priority application filed in Japan as Serial No. 2010-060393 on Mar. 17, 2010, both of which are incorporated by reference.

TECHNICAL FIELD

The present invention relates to a nonvolatile memory device and a semiconductor device including the memory device.

BACKGROUND ART

A nonvolatile semiconductor memory device (hereinafter, simply referred to as a memory device) which is capable of writing and erasing data repeatedly, such as an EEPROM or a flash memory, is convenient and has high resistance to physical impact. Therefore, it has been mainly used for a portable memory medium such as a USB flash drive or a memory card, an RF tag which is a medium for radio frequency identification (RFID) in which data is read wirelessly, or the like, and has been widely available on the market. In the memory device, a transistor which functions as a memory element is included in each memory cell. Further, the transistor has an electrode called a floating gate, between a gate electrode and a semiconductor film serving as an active layer. The accumulation of charge in the floating gate enables storage of data.

In Patent Documents 1 and 2, a thin film transistor including a floating gate which is formed over a glass substrate is described.

REFERENCE

Patent Documents

[Patent Document 1] Japanese Published Patent Application No. H6-021478
[Patent Document 2] Japanese Published Patent Application No. 2005-322899

DISCLOSURE OF INVENTION

In a flash memory or an EEPROM, a defect in data writing is caused by the following problems, for example: a sufficient amount of charge is not accumulated in a floating gate because voltage applied to a memory element is too low; and a memory element is damaged or degraded because voltage applied to a memory element is too high. That is to say, in order to avoid such a writing defect, it is important to set the level of the voltage applied to the memory element within an appropriate range.

However, in some cases, voltage levels appropriate for data writing vary among memory cells. This is mainly caused by variation in the characteristics of memory elements among memory cells due to insulating films which are not uniform in thickness between floating gates and active layers in transistors functioning as the memory elements.

Further, the levels of voltage itself to be supplied to memory elements vary easily among memory devices. For example, in the case where voltage to be supplied to a memory element is generated in a boosting circuit, the voltage is controlled to within predetermined levels by a limiter in the boosting circuit. However, when the threshold voltages of transistors included in boosting circuits or transistors included in limiters vary, the levels of voltage generated in the boosting circuits vary. In particular, in a passive-type RF tag, voltage generated by receipt of a radio wave is controlled to a predetermined level by a constant voltage circuit such as a regulator, and then supplied to a limiter in a boosting circuit as power supply voltage. Therefore, if the levels of power supply voltage to be supplied to limiters vary due to variation in threshold voltage of transistors included in constant voltage circuits, the upper limit or the lower limit of voltage output from each of the limiters varies; thus, the levels of voltage supplied to memory cells vary more largely.

As one of methods for avoiding such a defect in data writing which is caused by variation in the characteristics of memory elements and variation in the levels of voltage supplied to the memory elements, there is a method in which data is written a plurality of times and voltage is gradually increased in accordance with the number of writing times. With the use of the method, application of excess voltage to the memory element can be prevented, and further, a situation in which a sufficient amount of charge is not accumulated in a floating gate due to shortage of voltage can be avoided. Thus, the occurrence of the defect in writing can be suppressed.

Meanwhile, in the above method, verifying operation for verifying whether data is correctly stored is performed every time writing operation is performed. For the verifying operation, a memory device called a data buffer for temporarily storing data is additionally needed. For the data buffer, for example, a volatile memory device such as a DRAM, an SRAM, or a register which includes a flip-flop can be used. However, since the area of a register for one bit is large; therefore, when much data is stored at one time, it is difficult for a data buffer to have a small area. Thus, the reduction in size of the whole memory device including the data buffer is inhibited. Further, the register needs a large number of transistors for one bit, and power supply voltage needs to be supplied to the register all the time when data is held. Therefore, consumption current increases easily due to off-state current or leakage current of the transistor. In the case of an SRAM or a DRAM, the size can be reduced easily as compared to the case of using a register. However, consumption current of an SRAM increases easily due to the reason similar to the register. Consumption current of a DRAM also increases easily during data holding because refresh operation is needed.

In view of the foregoing problems, one of objects of the disclosed invention is to provide a nonvolatile memory device in which the occurrence of a defect in data writing is suppressed and whose area can be made small, or a semiconductor device including the nonvolatile memory device. Alternatively, one of objects of the disclosed invention is to provide a nonvolatile memory device in which the occurrence of a defect in data writing is suppressed and power consumption can be suppressed, or a semiconductor device including the nonvolatile memory device.

A memory device according to one embodiment of the present invention includes a first memory portion having a nonvolatile memory element, and a second memory portion (data buffer) for temporarily storing data in verifying operation in which whether the data is correctly written into the first memory portion is verified. Further, in a memory device according to one embodiment of the present invention, the second memory portion includes a memory element and an insulated gate field effect transistor (hereinafter simply referred to as a transistor) with extremely low off-state current or extremely low leakage current. The transistor is provided in order to control holding of charge in the memory element.

The second memory portion can temporarily store data read from the first memory portion, data including the result of the verifying operation, and the like in addition to data written into the first memory portion; each data may be stored in one second memory portion or a plurality of second memory portions.

The transistor in the second memory portion includes, in a channel formation region, a semiconductor material which has band gap wider than the band gap of a silicon semiconductor and has intrinsic carrier density lower than the intrinsic carrier density of silicon. With a channel formation region including a semiconductor material having the above characteristics, a transistor with extremely low off-state current or extremely low leakage current can be realized. As examples of such a semiconductor material, an oxide semiconductor having a band gap which is approximately three times as large as that of silicon can be given. The transistor with such a structure is used as a switching element for holding charge accumulated in a memory element, whereby leakage of charge from the memory element can be prevented in the second memory portion.

An oxide semiconductor is a metal oxide exhibiting semiconductor characteristics, which includes a high mobility which is almost the same as that of microcrystalline silicon or polycrystalline silicon, and a uniformity in characteristics of elements which is almost the same as that of amorphous silicon. An oxide semiconductor highly-purified (a purified OS) by reduction in concentration of impurities such as moisture or hydrogen, which serves as electron donors (donors), is an intrinsic semiconductor (an i-type semiconductor) or a substantially intrinsic semiconductor. Therefore, a transistor including the above oxide semiconductor has a characteristic of extremely low off-state current or extremely low leakage current. Specifically, the concentration of hydrogen in the highly purified oxide semiconductor, which is measured by secondary ion mass spectrometry (SIMS), is $5 \times 10^{19}/cm^3$ or less, preferably $5 \times 10^{18}/cm^3$ or less, more preferably $5 \times 10^{17}/cm^3$ or less, still more preferably less than $1 \times 10^{16}/cm^3$. In addition, the carrier density of the oxide semiconductor film, which is measured by Hall effect measurement, is less than $1 \times 10^{14}/cm^3$, preferably less than $1 \times 10^{12}/cm^3$, more preferably less than $1 \times 10^{11}/cm^3$. Furthermore, the band gap of the oxide semiconductor is 2 eV or more, preferably 2.5 eV or more, more preferably 3 eV or more. By using a highly purified oxide semiconductor film with sufficiently reduced concentration of impurities such as moisture and hydrogen, off-state current or leakage current of the transistor can be reduced.

The analysis of the concentration of hydrogen in the oxide semiconductor film is described here. The concentrations of hydrogen in the oxide semiconductor film and a conductive film are measured by secondary ion mass spectrometry (SIMS). It is known that it is difficult to obtain correct data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Various experiments can actually prove low off-state current of the transistor including the highly-purified oxide semiconductor film as an active layer. For example, even with an element with a channel width of $1 \times 10^6$ µm and a channel length of 10 µm, in a range of from 1 V to 10 V of voltage (drain voltage) between a source electrode and a drain electrode, it is possible that off-state current (which is drain current in the case where voltage between a gate electrode and the source electrode is 0 V or less) is less than or equal to the measurement limit of a semiconductor parameter analyzer, that is, less than or equal to $1 \times 10^{-13}$ A. In this case, it can be found that an off-state current density corresponding to a value obtained by dividing the off current by the channel width of the transistor is less than or equal to 100 zA/µm. Further, in the experiment, a capacitor and a transistor (the thickness of a gate insulating film is 100 nm) are connected to each other and a circuit in which charge flowing into or from the capacitor was controlled by the transistor is used. When the highly-purified oxide semiconductor film is used as a channel formation region in the transistor, and the off-state current of the transistor is measured from a change in the amount of charge of the capacitor per unit time, it is found that in the case where the voltage between the source electrode and the drain electrode of the transistor is 3 V, lower off-state current of 10 zA/µm to 100 zA/µm can be obtained. Therefore, in the semiconductor device according to one embodiment of the present invention, the off-state current density of the transistor including the highly-purified oxide semiconductor film as an active layer can be lower than or equal to 10 zA/µm, preferably lower than or equal to 1 zA/µm, more preferably lower than or equal to 1 yA/µm, depending on the voltage between the source electrode and drain electrode. Accordingly, the transistor including the highly-purified oxide semiconductor film as an active layer has much lower off-state current than a transistor including silicon having crystallinity.

In addition, a transistor including a highly-purified oxide semiconductor shows almost no temperature dependence of off-state current. This is because the conductivity type is made to be as close to an intrinsic type as possible by removing impurities which become electron donors (donors) in the oxide semiconductor to highly purify the oxide semiconductor, so that the Fermi level positions in a center of the forbidden band. This also results from the fact that the oxide semiconductor has an energy gap of 3 eV or more and includes very few thermally excited carriers. In addition, the source electrode and the drain electrode are in a degenerated state, which is also a factor for showing no temperature dependence. The transistor is operated mainly with carriers which are injected from the degenerated source electrode into the oxide semiconductor, and the above independence of off-state current in temperature can be explained by independence of the carrier density in temperature.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—

Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor can be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric proportion. The above oxide semiconductor may include silicon.

Moreover, oxide semiconductors can be represented by the chemical formula, $InMO_3(ZnO)_m$ (m>0). Here, M represents one or more metal elements selected from Ga, Al, Mn, and Co.

In a second memory portion, a transistor with the aforementioned structure is used as a switching element for controlling holding of charge in a memory element, whereby charge can be prevented from leaking from the memory element. Therefore, the second memory portion with the aforementioned structure can hold data for a longer period of time as compared to the case of using a DRAM. Thus, refresh operation is not needed in the verifying operation. Further, it is not necessary to supply voltage to the second memory portion with the aforementioned structure all the time when data is held, which is different from the case of using a register or an SRAM. Therefore, in the memory device according to one embodiment of the present invention, power consumption in data writing can be suppressed as compared to the case of using a DRAM, an SRAM, or a register.

With the second memory portion having the aforementioned structure, the number of transistors in one memory cell can be made small as compared to the case of using a register including a flip-flop. Therefore, the area of the second memory portion can be made small as compared to the case of using the register, and further, the whole memory device including the second memory portion can be reduced in size.

BRIEF DESCRIPTION OF DRAWINGS

FIG. 4 schematically illustrates the flow of data written into a second memory portion.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiment modes below.

Note that the present invention includes, in its category, all the semiconductor devices in which memory devices can be used: for example, integrated circuits such as microprocessors and image processing circuits, RF tags, memory media, and semiconductor display devices. Further, the semiconductor display devices include semiconductor display devices in which circuit elements using semiconductor films are included in pixel portions or driver circuits, such as liquid crystal display devices, light-emitting devices in which a light-emitting element typified by an organic light-emitting element (OLED) is provided for each pixel, electronic paper, digital micromirror devices (DMD), plasma display panels (PDP), field emission displays (FED), and the like, in its category.

(Embodiment 1)

Figure 1A:
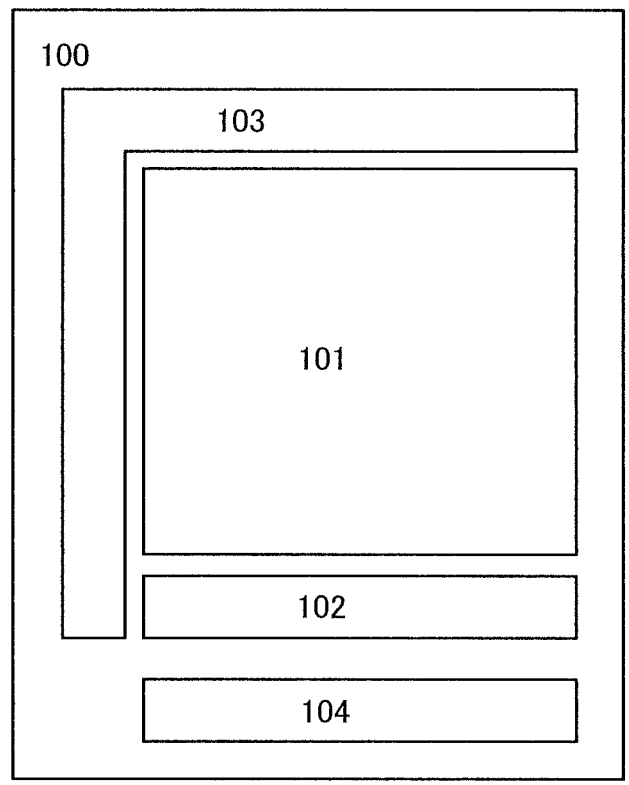
FIGS. 1A and 1B illustrate structures of a memory device and a memory cell.

FIG. 1A illustrates a block diagram of a structure of a memory device according to one embodiment of the present invention, as an example. A memory device 100 illustrated in FIG. 1A includes a first memory portion 101, a second memory portion 102, a driver circuit 103, and a comparison circuit 104.

A plurality of memory cells each including a nonvolatile memory element are provided in the first memory portion 101. Further, a plurality of memory cells each including a memory element and a transistor are provided in the second memory portion 102. The transistor is provided to control the holding of charge in the memory element; the off-state current or the leakage current of the transistor is extremely low.

The driver circuit 103 controls the operation of the first memory portion 101. Specifically, various kinds of operation such as the writing of data into the first memory portion 101, the reading of data from the first memory portion 101, the holding of data in the first memory portion 101, and the erasing of data in the first memory portion 101 can be controlled in accordance with a signal from a control circuit.

Further, the driver circuit 103 controls the operation of the second memory portion 102. Specifically, various kinds of operation such as the writing of data into the second memory portion 102, the reading of data from the second memory portion 102, and the holding of data in the second memory portion 102 can be controlled in accordance with a signal from the control circuit.

Although FIG. 1A illustrates an example in which the operation of the first memory portion 101 and the operation of the second memory portion 102 are controlled by one driver circuit 103, one embodiment of the present invention is not limited to this. The operation of the first memory portion 101 and the operation of the second memory portion 102 may be controlled by different driver circuits. Alternatively, a driver circuit which controls the operation of the first memory portion 101 and a driver circuit which controls the operation of the second memory portion 102 may have a common portion.

FIG. 1A particularly illustrates the case where the control circuit for supplying a signal to the driver circuit 103 is not included in the memory device 100 but provided in the outside of the memory device 100. However, the control circuit may be included in components of the memory device.

The comparison circuit 104 verifies whether data written into the first memory portion 101 is correctly stored, through verifying operation. In the verifying operation, data is temporarily held in the second memory portion 102.

Figure 1B:
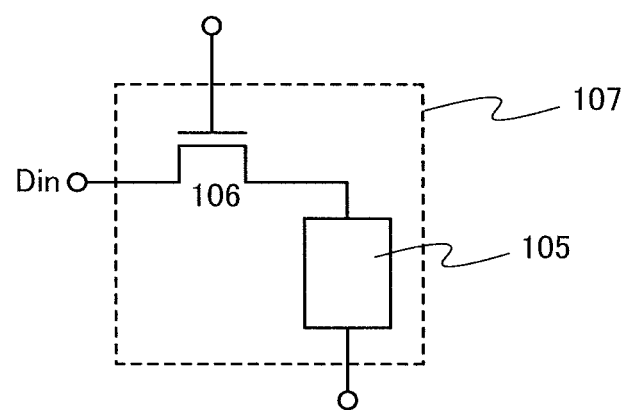

FIG. 1B is a circuit diagram illustrating a structure of a memory cell included in the second memory portion 102, as an example. In the circuit diagram shown in FIG. 1B, a memory cell 107 includes a memory element 105 and a transistor 106 which functions as a switching element. A semiconductor element such as a capacitor or a transistor can be used for the memory element 105. In the memory element 105, charge is accumulated in a capacitor or a gate capacitance formed between a gate electrode and an active layer of a transistor, whereby data is stored.

Note that the memory cell 107 may further have another circuit element such as a transistor, a diode, a resistor, or an inductor as needed.

A feature of one embodiment of the present invention is that a channel formation region of the transistor 106 which functions as a switching element includes a semiconductor material whose band gap is wider than that of a silicon semiconductor and whose intrinsic carrier density is lower than that of silicon. When a semiconductor material having such characteristics is included in the channel formation region, the transistor 106 with extremely low off-state current or extremely low leakage current can be realized. The transistor 106 with the above-described structure is used as a switching element for holding charge accumulated in the memory element 105, whereby leakage of charge from the memory element 105 in the second memory portion 102 can be prevented.

As one example of a semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be employed. Among the above, an oxide semiconductor has an advantage of high mass productivity because an oxide semiconductor can be formed by sputtering, a wet process (e.g., a printing method), or the like. In addition, the deposition temperature of an oxide semiconductor is 300° C. to 500° C. (a glass transition temperature or less, and approximately 700° C. at a maximum) whereas the process temperature of silicon carbide and process temperature of gallium nitride are approximately 1500° C. and approximately 1100° C., respectively. Therefore, an oxide semiconductor can be formed over a glass substrate which is inexpensively available and it is possible to stack a semiconductor element formed using an oxide semiconductor over an integrated circuit using a semiconductor material which does not have heat resistance high enough to withstand heat treatment at 1500° C. to 2000° C. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

In the following description, the case where an oxide semiconductor with the above advantages is used as the semiconductor film of the transistor 106 is given as an example.

Note that in FIG. 1B, the transistor 106 has a gate electrode on one side of the active layer. When the transistor 106 has a pair of gate electrodes having the active layer therebetween, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be applied to the pair of electrodes, or a fixed potential such as a ground potential may be applied only to the other of the gate electrodes. When the level of the potential supplied to the other of the gate electrodes is controlled, the threshold voltage of the transistor 106 can be controlled.

Note that although in FIG. 1B, the memory cell 107 includes one transistor 106 which functions as a switching element, the present invention is not limited to this structure. In one embodiment of the present invention, it is acceptable as long as at least one transistor which functions as a switching element is provided in each memory cell, and the number of such transistors may be plural. In the case where the memory cell 107 includes a plurality of transistors which function as switching elements, the plurality of transistors may be connected to each other in parallel, in series, or in combination of parallel connection and series connection.

Note that the state in which the transistors are connected to each other in series refers to the state in which only one of a source electrode and a drain electrode of a first transistor is connected to only one of a source electrode and a drain electrode of a second transistor. Further, the state in which the transistors are connected to each other in parallel refers to the state in which the source electrode of the first transistor is connected to the source electrode of the second transistor and the drain electrode of the first transistor is connected to the drain electrode of the second transistor.

Unless otherwise specified, in this specification, in the case of an n-channel transistor (p-channel transistor), off-state current is current which flows between a source electrode and a drain electrode when a potential of the drain electrode is higher (lower) than that of the source electrode and that of a gate electrode while the potential of the source electrode is equal to the potential of the gate electrode. Further, unless otherwise specified, leakage current is current which flows between a source electrode and a gate electrode or between a drain electrode and the gate electrode, through an insulating film.

Next, the operation of the memory device 100 is described. In the memory device 100, data transmitted from the control circuit is written into the first memory portion 101 by the driver circuit 103.

After first writing of data into the first memory portion 101 is finished, verifying operation for verifying whether data is normally written into the first memory portion 101 is performed. Specifically, reference data transmitted from the control circuit and data read from the first memory portion 101 are compared to each other. The reference data transmitted from the control circuit is temporarily held in the second memory portion 102. The comparison circuit 104 compares the data read from the first memory portion 101 and the data temporarily held in the second memory portion 102, and the comparison result is output as data. The output data including the result of the verifying operation is temporarily held in the second memory portion 102.

Note that in the verifying operation, the data read from the first memory portion 101 may be temporarily held in the second memory portion 102.

When it is confirmed that data in all bit positions is normally written into the first memory portion 101 as a result of the verifying operation, the operation of writing data into the first memory portion 101 is finished.

When a writing defect in which data is not normally written is detected in the first memory portion 101 as a result of the verifying operation, data in a bit position which is detected as the defect is written again into the first memory portion 101 in the memory device 100. In the case of writing data again, the absolute value of voltage to be applied to the memory element 105 in the memory cell 107 where data is to be written again is made larger than that of voltage applied to the memory element 105 in the preceding writing, or voltage is applied to the memory element 105 for a longer period of time than that applied in the preceding writing. Alternatively, data may be written again with the use of the two structures in combination.

After the second writing is finished, whether data is correctly stored is verified again through the verifying operation. The procedure is repeated until a writing defect is not detected, whereby correct data can be written into the first memory portion 101.

FIGS. 2A to 2E illustrate specific examples of structures of the memory cell 107.

Figure 2A:
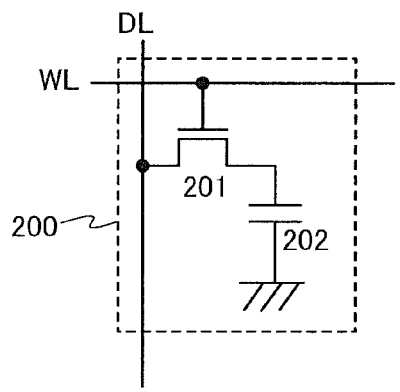
FIGS. 2A to 2E illustrate structures of memory cells.

A memory cell 200 shown in FIG. 2A includes a transistor 201 which functions as a switching element and a capacitor 202 which functions as a memory element. A gate electrode of the transistor 201 is connected to a word line WL. One of a source electrode and a drain electrode of the transistor 201 is connected to a data line DL, and the other of the source electrode and the drain electrode thereof is connected to one of electrodes of the capacitor 202. The other of the electrodes of the capacitor 202 is connected to a node to which a fixed potential such as a ground potential is supplied.

Note that the term "connection" in this specification refers to electrical connection and corresponds to the state in which current, voltage, or a potential can be supplied or transmitted. Accordingly, a connection state means not only a state of a direct connection but also a state of indirect connection through a circuit element such as a wiring, a resistor, a diode, or a transistor so that current, voltage, or a potential can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In addition, a source electrode and a drain electrode of a transistor may be interchangeably referred to depending on polarity of the transistor and a difference between potentials given to electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In this specification, although the connection relationship of transistors is sometimes described under the assumption that a source electrode and a drain electrode are fixed for the sake of convenience, in reality, the source electrode and the drain electrode may be interchangeably referred to depending on the potential relationship.

In the memory cell 200 shown in FIG. 2A, in data writing, the transistor 201 is turned on, so that a potential of a signal including data is supplied from the data line DL to the one of the electrodes of the capacitor 202 through the transistor 201. The amount of charge accumulated in the capacitor 202 is controlled in accordance with the potential of the signal, so that data is written into the capacitor 202.

In data holding, the transistor 201 is turned off, so that the charge is held in the capacitor 202. As described above, the transistor 201 has a characteristic of having extremely low off-state current or extremely low leakage current. Therefore, the charge accumulated in the capacitor 202 is difficult to leak, and thus, the data can be held for a long period of time as compared to the case of using a semiconductor material such as silicon for the transistor 201.

In data reading, the transistor 201 is turned on, so that the charge accumulated in the capacitor 202 is taken out through the data line DL. The difference in the amount of charge is read, whereby data can be read.

Figure 2B:
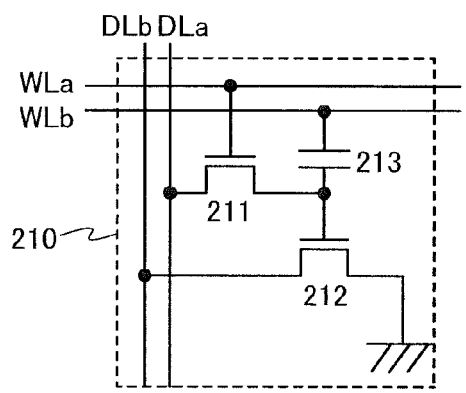

A memory cell 210 shown in FIG. 2B includes a transistor 211 which functions as a switching element, and a transistor 212 and a capacitor 213 which function as memory elements. A gate electrode of the transistor 211 is connected to a first word line WLa. One of a source electrode and a drain electrode of the transistor 211 is connected to a first data line DLa, and the other of the source electrode and the drain electrode thereof is connected to a gate electrode of the transistor 212. One of a source electrode and a drain electrode of the transistor 212 is connected to a second data line DLb, and the other of the source electrode and the drain electrode thereof is connected to a node to which a fixed potential such as a ground potential is supplied. As for a pair of electrodes of the capacitor 213, one of the electrodes is connected to the gate electrode of the transistor 212, and the other thereof is connected to a second word line WLb.

In the memory cell 210 shown in FIG. 2B, in data writing, the transistor 211 is turned on, so that a potential of a signal including data is supplied from the first data line DLa to the gate electrode of the transistor 212 through the transistor 211. The amount of charge accumulated in a gate capacitance of the transistor 212 and the capacitor 213 is controlled in accordance with the potential of the signal, so that data is written into the transistor 212 and the capacitor 213.

In data holding, the transistor 211 is turned off, so that the charge accumulated in the gate capacitance of the transistor 212 and the capacitor 213 is held. As described above, the transistor 211 has a characteristic of having extremely low off-state current or extremely low leakage current. Therefore, the accumulated charge is difficult to leak, and thus, the data can be held for a long period of time as compared to the case of using a semiconductor material such as silicon for the transistor 211.

In data reading, a potential of the second word line WLb is changed. The potential difference between the pair of electrodes of the capacitor 213 is kept in accordance with the principle of charge conservation; thus, the change in the potential of the second word line WLb is supplied to the gate electrode of the transistor 212. The threshold voltage of the transistor 212 is changed depending on the amount of charge accumulated in the gate capacitance of the transistor 212. The difference in the amount of accumulated charge is read from the amount of drain current of the transistor 212 which is obtained through the change in the potential of the gate electrode of the transistor 212, whereby data can be read.

Note that an oxide semiconductor film may be used for an active layer of the transistor 212 which functions as a memory element. Alternatively, for the active layer of the transistor 212, the following semiconductors other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Note that when oxide semiconductor films are used for all of the transistors in the memory cell 210, a manufacturing process can be simplified. Further, for example, the active layer of the transistor 212 which functions as a memory element is formed using a semiconductor material such as polycrystalline silicon or single crystal silicon which provides higher mobility than an oxide semiconductor, whereby data can be read from the memory cell 210 at high speed.

Figure 2C:
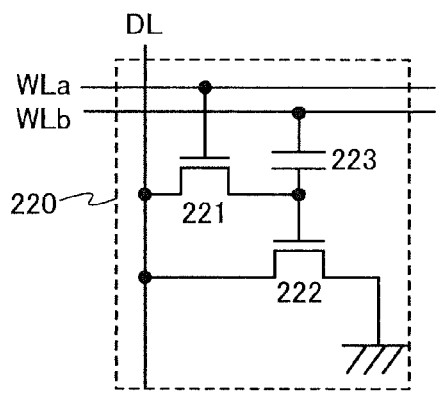

A memory cell 220 shown in FIG. 2C is different from the memory cell 210 shown in FIG. 2B in that one data line DL has functions of the first data line DLa and the second data line DLb. Specifically, the memory cell 220 shown in FIG. 2C includes a transistor 221 which functions as a switching element, and a transistor 222 and a capacitor 223 which function as memory elements. A gate electrode of the transistor 221 is connected to a first word line WLa. One of a source electrode and a drain electrode of the transistor 221 is connected to the data line DL, and the other of the source electrode and the drain electrode thereof is connected to a gate electrode of the transistor 222. One of a source electrode and a drain electrode of the transistor 222 is connected to the data line DL, and the other of the source electrode and the drain electrode thereof is connected to a node to which a fixed potential such as a ground potential is supplied. As for a pair of electrodes of the capacitor 223, one of the electrodes is connected to the gate electrode of the transistor 222, and the other thereof is connected to a second word line WLb.

Operation such as data writing, data holding, and data reading can be performed in the memory cell 220 shown in FIG. 2C in a manner similar to that in the memory cell 210 shown in FIG. 2B.

Note that an oxide semiconductor film may be used for an active layer of the transistor 222 which functions as a memory element. Alternatively, for the active layer of the transistor 222, the following semiconductors other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Note that when oxide semiconductor films are used for all of the transistors in the memory cell 220, a manufacturing process can be simplified. Further, for example, the active layer of the transistor 222 which functions as a memory element is formed using a semiconductor material such as polycrystalline silicon or single crystal silicon which provides higher mobility than an oxide semiconductor, whereby data can be read from the memory cell 220 at high speed.

Figure 2D:
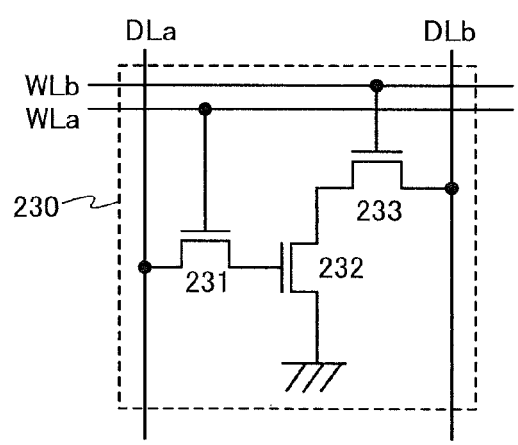

A memory cell 230 shown in FIG. 2D includes a transistor 231 which functions as a switching element, a transistor 232 which functions as a memory element, and a transistor 233 which functions as a switching element for controlling data reading. A gate electrode of the transistor 231 is connected to a first word line WLa. One of a source electrode and a drain electrode of the transistor 231 is connected to a first data line DLa, and the other of the source electrode and the drain electrode thereof is connected to a gate electrode of the transistor 232. One of a source electrode and a drain electrode of the transistor 232 is connected to one of a source electrode and a drain electrode of the transistor 233, and the other of the source electrode and the drain electrode of the transistor 232 is connected to a node to which a fixed potential such as a ground potential is supplied. The other of the source electrode and the drain electrode of the transistor 233 is connected to a second data line DLb. A gate electrode of the transistor 233 is connected to a second word line WLb.

In the memory cell 230 shown in FIG. 2D, in data writing, the transistor 231 is turned on, so that a potential of a signal including data is supplied from the first data line DLa to the gate electrode of the transistor 232 through the transistor 231. The amount of charge accumulated in a gate capacitance of the transistor 232 is controlled in accordance with the potential of the signal, so that data is written into the transistor 232.

In data holding, the transistor 231 is turned off, so that the charge accumulated in the gate capacitance of the transistor 232 is held. As described above, the transistor 231 has a characteristic of having extremely low off-state current or extremely low leakage current. Therefore, the accumulated charge is difficult to leak, and thus, data can be held for a long period of time as compared to the case of using a semiconductor material such as silicon.

In data reading, a potential of the second word line WLb is changed, whereby the transistor 233 is turned on. When the transistor 233 is turned on, drain current having an amount corresponding to the amount of charge accumulated in the gate capacitance of the transistor 232 flows through the transistor 232. The difference in the amount of accumulated charge is read from the amount of the drain current of the transistor 232, whereby data can be read.

Note that an oxide semiconductor film may be used for an active layer of the transistor 232 or the transistor 233 which functions as a memory element. Alternatively, for the active layer of the transistor 232 or the transistor 233, the following semiconductors other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Note that when oxide semiconductor films are used for all of the transistors in the memory cell 230, a manufacturing process can be simplified. Further, for example, the active layer of the transistor 232 or the transistor 233 which functions as a memory element is formed using a semiconductor material such as polycrystalline silicon or single crystal silicon which provides higher mobility than an oxide semiconductor, whereby data can be read from the memory cell 230 at high speed.

Figure 2E:
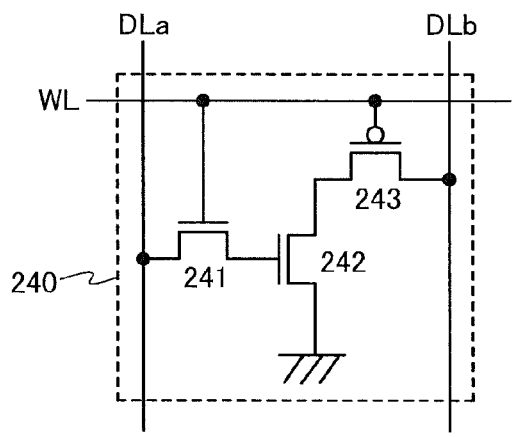

A memory cell 240 shown in FIG. 2E is different from the memory cell 230 shown in FIG. 2D in that one word line WL has functions of the first word line WLa and the second word line WLb. Specifically, the memory cell 240 shown in FIG. 2E includes a transistor 241 which functions as a switching element, a transistor 242 which functions as a memory element, and a transistor 243 which functions as a switching element for controlling data reading. The conductivity type of the transistor 243 is different from that of the transistor 242. A gate electrode of the transistor 241 is connected to the word line WL. One of a source electrode and a drain electrode of the transistor 241 is connected to a first data line DLa, and the other of the source electrode and the drain electrode thereof is connected to a gate electrode of the transistor 242. One of a source electrode and a drain electrode of the transistor 242 is connected to one of a source electrode and a drain electrode of the transistor 243, and the other of the source electrode and the drain electrode of the transistor 242 is connected to a node to which a fixed potential such as a ground potential is supplied. The other of the source electrode and the drain electrode of the transistor 243 is connected to a second data line DLb. A gate electrode of the transistor 243 is connected to the word line WL.

Operation such as data writing, data holding, and data reading can be performed in the memory cell 240 shown in FIG. 2E in a manner similar to that in the memory cell 230 shown in FIG. 2D.

Note that an oxide semiconductor film may be used for an active layer of the transistor 242 which functions as a memory element. Alternatively, for the active layer of the transistor 242, the following semiconductors other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Further, for example, the active layer of the transistor 242 which functions as a memory element is formed using a semiconductor material such as polycrystalline silicon or single crystal silicon which provides higher mobility than an oxide semiconductor, whereby data can be read from the memory cell 240 at high speed.

Figure 3A:
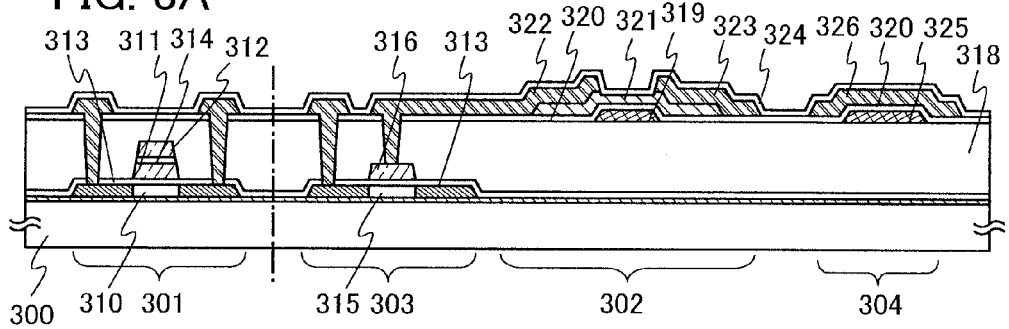
FIGS. 3A to 3C are cross-sectional views of memory cells.

FIG. 3A illustrates an example of a cross-sectional view of a memory cell included in the first memory portion and a memory cell included in the second memory portion, with the use of the memory cell 210 including the circuit configuration shown in FIG. 2B as an example.

In the cross-sectional view shown in FIG. 3A, a transistor 301 included in the first memory portion and a transistor 302, a transistor 303, and a capacitor 304 which are included in the second memory portion are formed over a substrate 300 having an insulating surface.

The transistor 301 functions as a memory element of the first memory portion. The transistor 301 includes an active layer 310, an electrode 311 which functions as a floating gate, a gate electrode 312, an insulating film 313, and an insulating film 314. The electrode 311 is placed between the active layer 310 and the gate electrode 312. The insulating film 313 is provided between the electrode 311 and the active layer 310, and the insulating film 314 is provided between the electrode 311 and the gate electrode 312.

The transistor 303 functions as a memory element of the second memory portion. The transistor 303 includes an active layer 315, a gate electrode 316, and the insulating film 313. The insulating film 313 is provided between the gate electrode 316 and the active layer 315.

The transistor 302 functions as a switching element of the second memory portion. The transistor 302 is formed over an insulating film 318 covering the transistor 301 and the transistor 303. Specifically, the transistor 302 includes, over the insulating film 318, a gate electrode 319; an insulating film 320 over the gate electrode 319; an active layer 321 including an oxide semiconductor which overlaps with the gate electrode 319 with the insulating film 320 interposed therebetween; and a source electrode 322 and a drain electrode 323 over the active layer 321. The transistor 302 may further include an insulating film 324 covering the active layer 321, the source electrode 322, and the drain electrode 323 as its component. The transistor 302 is a bottom-gate type transistor having a channel-etched structure in which part of the active layer 321 is etched between the source electrode 322 and the drain electrode 323.

Note that the transistor 302 may further include a back gate electrode in a portion over the insulating film 324 which overlaps with a channel formation region of the active layer 321. When the back gate electrode is formed, an insulating film is formed so as to cover the back gate electrode. The back gate electrode may be in either a floating state where the electrode is electrically isolated, or a state where this electrode is given a potential. In the case of the latter, a potential whose level is as high as that of a potential supplied to the gate electrode 319 may be supplied to the back gate electrode, or a fixed potential such as a ground potential may be supplied to the back gate electrode. The level of the potential supplied to the back gate electrode is controlled, whereby the threshold voltage of the transistor 302 can be controlled.

The capacitor 304 is formed over the insulating film 318 like the transistor 302. The capacitor 304 includes, over the insulating film 318, a first electrode 325; the insulating film 320 overlapping with the first electrode 325; and a second electrode 326 overlapping with the first electrode 325 with the insulating film 320 interposed therebetween. The first electrode 325 and the gate electrode 319 of the transistor 302 can be formed by patterning one conductive film. Further, the second electrode 326, and the source electrode 322 and the drain electrode 323 of the transistor 302 can be formed by patterning one conductive film.

Note that the capacitor 304 is not necessarily formed over the insulating film 318 like the transistor 302; for example, the capacitor 304 may be formed under the insulating film 318 along with the transistor 301 or the transistor 303.

Although FIG. 3A illustrates the case where the transistor 302 is a bottom-gate type transistor having a channel-etched structure, one embodiment of the present invention is not limited thereto.

Figure 3B:
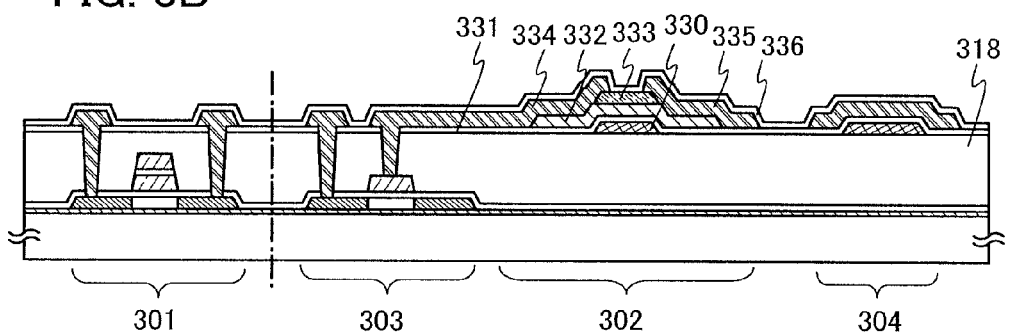

FIG. 3B illustrates an example of a cross-sectional view of a memory cell included in the first memory portion and a memory cell included in the second memory portion. FIG. 3B is different from FIG. 3A in that a transistor 302 has a channel protective structure.

The transistor 302 shown in FIG. 3B includes, over an insulating film 318, a gate electrode 330; an insulating film 331 over the gate electrode 330; an active layer 332 including an oxide semiconductor which overlaps with the gate electrode 330 over the insulating film 331; a channel protective film 333 formed in a portion over the active layer 332 which overlaps with the gate electrode 330; and a source electrode 334 and a drain electrode 335 formed over the active layer 332. The transistor 302 may further include an insulating film 336 provided over the active layer 332, as its component.

The channel protective film 333 can prevent a portion of the active layer 332 which is to be a channel formation region, from being damaged in a later step (for example, reduction in thickness due to plasma or an etchant in etching). Therefore, reliability of the transistor can be improved.

By using an inorganic material containing oxygen for the channel protective film 333, even when oxygen deficiency is generated in the active layer 332 owing to heat treatment for reducing moisture or hydrogen, oxygen can be supplied to a region of the active layer 332 which is in contact with at least the channel protective film 333 and oxygen deficiency which functions as a donor can be reduced, so that a structure which satisfies the stoichiometric composition ratio can be obtained. Therefore, the channel formation region can be intrinsic or substantially intrinsic, and variation in electrical characteristics of the transistor caused by oxygen deficiency is reduced; accordingly, the electrical characteristics can be improved.

Note that the transistor 302 may further include a back gate electrode over the insulating film 336. The back gate electrode is formed to overlap with a channel formation region of the active layer 332. The back gate electrode may be in either a floating state where the electrode is electrically isolated, or a state where this electrode is given a potential. In the case of the latter, a potential whose level is as high as that of a potential supplied to the gate electrode 330 may be supplied to the back gate electrode, or a fixed potential such as a ground potential may be supplied to the back gate electrode. The level of the potential supplied to the back gate electrode is controlled, whereby the threshold voltage of the transistor 302 can be controlled.

Figure 3C:
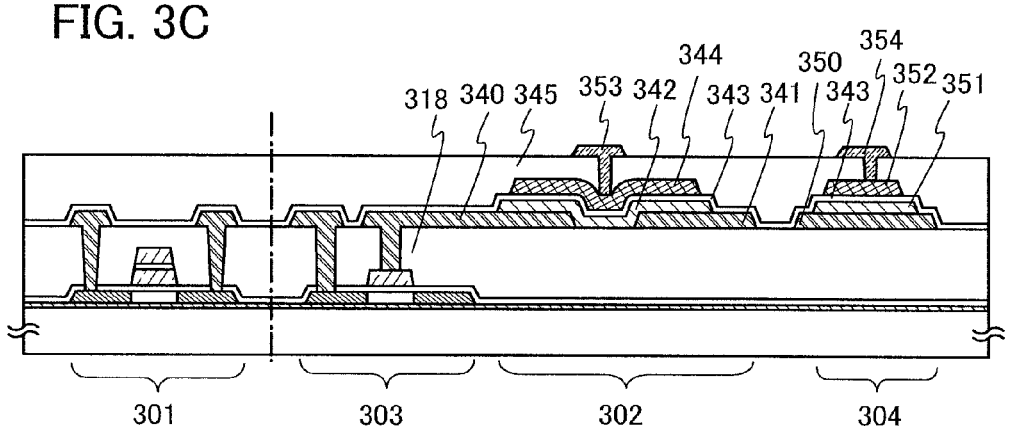

FIG. 3C illustrates an example of a cross-sectional view of a memory cell included in the first memory portion and a memory cell included in the second memory portion. FIG. 3C is different from FIG. 3A in that a transistor 302 is a top-gate type transistor.

The transistor 302 shown in FIG. 3C includes, over an insulating film 318, a source electrode 340 and a drain electrode 341; an active layer 342 including an oxide semiconductor over the source electrode 340 and the drain electrode 341; an insulating film 343 over the active layer 342; and a gate electrode 344 in a portion over the insulating film 343 which overlaps with the active layer 342. The transistor 302 may further include an insulating film 345 formed over the gate electrode 344, as its component.

Further, the cross-sectional view shown in FIG. 3C is different from that shown in FIG. 3A also in the structure of a capacitor 304. Specifically, the capacitor 304 includes a conductive film 350, a semiconductor film 351 over the conductive film 350, an insulating film 343 covering the conductive film 350 and the semiconductor film 351, and a second electrode 352 overlapping with the conductive film 350 and the semiconductor film 351 with the insulating film 343 interposed therebetween. In the capacitor 304, the conductive film 350 and the semiconductor film 351 function as a first electrode of the capacitor 304. The conductive film 350, and the source electrode 340 and the drain electrode 341 of the transistor 302 are formed by patterning one conductive film. The semiconductor film 351 and the active layer 342 of the transistor 302 are formed by patterning one semiconductor film. The second electrode 352 and the gate electrode 344 of the transistor 302 are formed by patterning one conductive film.

Further, in the cross-sectional view shown in FIG. 3C, a conductive film 353 and a conductive film 354 which are in contact with the gate electrode 344 and the second electrode 352, respectively, through contact holes formed in the insulating film 345 are formed on the insulating film 345.

FIGS. 3A to 3C illustrate examples in which the transistors 301 and the transistors 303 are formed using thin semiconductor films; however, one embodiment of the present invention is not limited thereto. The memory element included in the first memory portion and the memory element included in the second memory portion may be formed using a bulk semiconductor substrate.

Although FIGS. 3A to 3C illustrate examples of the case where the transistors 301 to 303 have a single-gate structure, the transistors may have a multi-gate structure in which a plurality of electrically connected gate electrodes are included so that a plurality of channel formation regions are included.

FIGS. 3A to 3C illustrate examples of the case where the transistor 301, the transistor 302, the transistor 303, and the capacitor 304 are formed over one substrate 300; however, one embodiment of the present invention is not limited thereto. Semiconductor elements such as the memory element included in the first memory portion and the memory element included in the second memory portion may be formed over different substrates.

Note that it is found that an oxide semiconductor film formed by sputtering or the like includes a large amount of impurities such as moisture or hydrogen. Moisture and hydrogen easily form a donor level and thus serve as impurities in the oxide semiconductor. Thus, heat treatment is performed on the oxide semiconductor film in a nitrogen atmosphere, an oxygen atmosphere, an atmosphere of ultra dry air, or a rare gas (e.g., argon and helium) atmosphere in order to highly purify the oxide semiconductor film by reducing impurities such as moisture or hydrogen in the oxide semiconductor film. It is desirable that the content of water in the gas be 20 ppm or less, preferably 1 ppm or less, and more preferably 10 ppb or less. The above heat treatment is preferably performed at 500° C. to 850° C. (alternatively, a strain point of a glass substrate or less) inclusive, more preferably 550° C. to 750° C. inclusive. Note that this heat treatment is performed at a temperature not exceeding the allowable temperature limit of the substrate to be used. An effect of elimination of moisture or hydrogen by heat treatment is confirmed by thermal desorption spectroscopy (TDS).

In one embodiment of the present invention, in the second memory portion, a transistor with extremely low off-state current or extremely low leakage current is used as a switching element for controlling the holding of charge in the memory element, whereby leakage of charge from the memory element can be prevented. Therefore, the second memory portion with the above structure can hold data for a long period of time as compared to the case of using a DRAM, and thus, refresh operation is not necessarily performed in the verifying operation. Further, voltage is not necessarily supplied to the second memory portion with the above structure all the time when data is held, which is different from the case of using a register or an SRAM. Thus, power consumption in data writing of a memory device according to one embodiment of the present invention can be further suppressed as compared to the case of using a DRAM, an SRAM, or a register.

Further, with the use of the second memory portion with the above structure, the number of transistors used in one memory cell can be made small as compared to the case of using a register including a flip-flop. Therefore, the area of the second memory portion can be made small as compared to the case of using the register, and further, the size of the whole memory device including the second memory portion can be made small.

(Embodiment 2)

The operation of the memory device of one embodiment of the present invention is described in more detail.

In this embodiment, the case where 8-bit data is written into a specified memory region including a plurality of memory cells is given as an example and the operation of the first memory portion is described. FIG. 4 schematically illustrates the flow of data written into the second memory portion in the operation of writing data into the first memory portion, as an example. In FIG. 4, four memory regions included in the second memory portion are used as four data buffers.

A memory region included in each data buffer has a memory capacity in which data having the same number of bits as data written into the first memory portion can be stored. In this embodiment, each data buffer includes at least a memory region for storing 8-bit data.

A data buffer for reference data which is shown in FIG. 4 is a data buffer for temporarily storing data (reference data) transmitted from a control circuit. Further, a data buffer for reading is a data buffer for temporarily storing data read from the first memory portion. A data buffer for writing 0 and a data buffer for writing 1 are data buffers for temporarily storing, as data, the result obtained through verifying operation.

Next, the writing operation is described. As for the operation of writing data into the first memory portion, first, data which has already been held in the first memory portion and data to be written are compared to each other.

In FIG. 4, reference data transmitted from the control circuit is written into the data buffer for reference data (800: reference data writing). FIG. 4 illustrates, as an example, the case where 8-bit reference data expressed as a digital value "01010101" is written into the data buffer for reference data.

Then, in FIG. 4, data which has already been held in the first memory portion is read and written into the data buffer for reading (801: prior writing). FIG. 4 illustrates, as an example, the case where 8-bit data expressed as a digital value "10101010" is read from the first memory portion and written into the data buffer for reading. While the data is written into the data buffer for reading, the data buffer for reference data keeps holding of the written reference data.

Note that FIG. 4 illustrates, as an example, the case where (801: prior writing) is performed after (800: reference data writing). However, one embodiment of the present invention is not limited to this structure, and (800: reference data writing) may be performed after (801: prior writing). In that case, while the reference data is written into the data buffer for reference data, the data buffer for reading keeps holding of the written data.

Then, in the comparison circuit, the reference data held in the data buffer for reference data and the data held in the data buffer for reading are compared to each other every bit. By the comparison, bits having the same digital value and bits having different digital values are distinguished from each other, and data including the comparison result (comparison data) is written into the data buffer for writing 0 and the data buffer for writing 1 (802: data comparison).

The comparison data stored in the data buffer for writing 0 is shown in FIG. 4 in the following manner: a bit having a digital value 0 in the reference data and having a digital value 1 in the data from the data buffer for reading is indicated by a circle (o), and a bit having a digital value 0 in the reference data and having a digital value 0 in the data from the data buffer for reading is indicated by a multiplication symbol (x). That is, a bit having a value in the comparison data which is indicated by o means a bit position into which a digital value 0 needs to be written, and a bit having a value in the comparison data which is indicated by x means a bit position into which a digital value 0 does not need to be written.

The comparison data stored in the data buffer for writing 1 is shown in FIG. 4 in the following manner: a bit having a digital value 1 in the reference data and having a digital value 0 in the data from the data buffer for reading is indicated by a circle (o), and a bit having a digital value 1 in the reference data and having a digital value 1 in the data from the data buffer for reading is indicated by a multiplication symbol (x). That is, a bit having a value in the comparison data which is indicated by o means a bit position into which a digital value 1 needs to be written, and a bit having a value in the comparison data which is indicated by x means a bit position into which a digital value 1 does not need to be written.

Then, the reference data is written into the first memory portion (803: execution of writing). As for the writing of the reference data into the first memory portion, the writing of a digital value 0 and the writing of a digital value 1 are separately performed. Further, the writing of the reference data is performed in accordance with the comparison data stored in the data buffer for writing 0 and the comparison data stored in the data buffer for writing 1.

In the case of FIG. 4, pieces of the reference data in a first bit position, a third bit position, a fifth bit position, and a seventh bit position are written into the first memory portion in accordance with the comparison data stored in the data buffer for writing 0. Further, the other pieces of the reference data in a second bit position, a fourth bit position, a sixth bit position, and an eighth bit position are written into the first memory portion in accordance with the comparison data stored in the data buffer for writing 1.

After the writing of the reference data into the first memory portion is finished, the verifying operation is performed in order to verify whether the data is normally written into the first memory portion. In FIG. 4, the data stored in the first memory portion is read and written into the data buffer for reading (804: data reading). FIG. 4 illustrates, as an example, the case where a defect in data writing occurs in the seventh bit position and the eighth bit position; 8-bit data expressed as a digital value "01010110" is read from the first memory portion and written into the data buffer for reading.

Then, in the comparison circuit, the reference data held in the data buffer for reference data and the data held in the data buffer for reading are compared to each other every bit. By the comparison, bits having the same digital value and bits having different digital values are distinguished from each other, and data including the comparison result (comparison data) is written into the data buffer for writing 0 and the data buffer for writing 1 (805: data comparison).

In FIG. 4, the comparison data stored in the data buffer for writing 0 includes o only in the seventh bit position, and the comparison data stored in the data buffer for writing 1 includes o only in the eighth bit position. This means that writing needs to be performed again in the first memory portion so that a piece of data having a digital value 0 is written in the seventh bit position and a piece of data having a digital value 1 is written in the eighth bit position.

Note that when it is confirmed in the comparison circuit that data in all bit positions are normally written, the operation of writing data into the first memory portion is finished.

In FIG. 4, a defect in data writing occurs in the seventh bit position and the eighth bit position; thus, the reference data is written again into the first memory portion (806: execution of writing). In the second and subsequent writing of the reference data into the first memory portion, only data corresponding to a bit position where the defect in writing occurs may be written. In FIG. 4, in accordance with the comparison data stored in the data buffer for writing 0 and the comparison data stored in the data buffer for writing 1, data having a digital value 0 is written into a portion of a memory region which corresponds to the seventh bit position, and data having a digital value 1 is written into a portion of the memory region which corresponds to the eighth bit position.

In the case of writing data again, the absolute value of voltage to be applied to a memory element in a memory cell in the portion of a memory region where data is to be written again is made larger than that of voltage applied to the memory element in the preceding writing, or voltage is applied to the memory element for a longer period of time than that applied in the preceding writing. Alternatively, data may be written again with the use of the two structures in combination. In the case of the first memory portion, voltage applied to a memory element corresponds to voltage between a gate electrode and a source electrode (or a source region) of a transistor used as the memory element.

After the writing of the reference data into the first memory portion is finished, the verifying operation is performed in order to verify whether the data is normally written into the first memory portion. In FIG. 4, the data stored in the first memory portion is read and written into the data buffer for reading (807: data reading). FIG. 4 illustrates, as an example, the case where data in all bit positions is normally written by the second writing of the reference data; 8-bit data expressed as a digital value "01010101" is read from the first memory portion and written into the data buffer for reading.

Then, in the comparison circuit, the reference data held in the data buffer for reference data and the data held in the data buffer for reading are compared to each other every bit. By the comparison, bits having the same digital value and bits having different digital values are distinguished from each other, and data including the comparison result (comparison data) is written into the data buffer for writing 0 and the data buffer for writing 1 (808: data comparison).

In the case where a defect in writing occurs again, a series of the above operation in which a piece of data in a concerned bit position is written again into the first memory portion and then the verifying operation is performed is repeated. In FIG. 4, it is confirmed in the comparison circuit that data in all bit positions is normally written, and thus, the operation of writing data into the first memory portion is finished (809: end of writing operation).

Although FIG. 4 illustrates a structure in which, in the verifying operation, data read from the first memory portion 101 is temporarily held in the data buffer for reading, one embodiment of the present invention is not limited thereto. The data held in the first memory portion and the reference data stored in the data buffer for reference data can be directly compared to each other in the comparison circuit, without the data buffer for reading.

Figure 5:
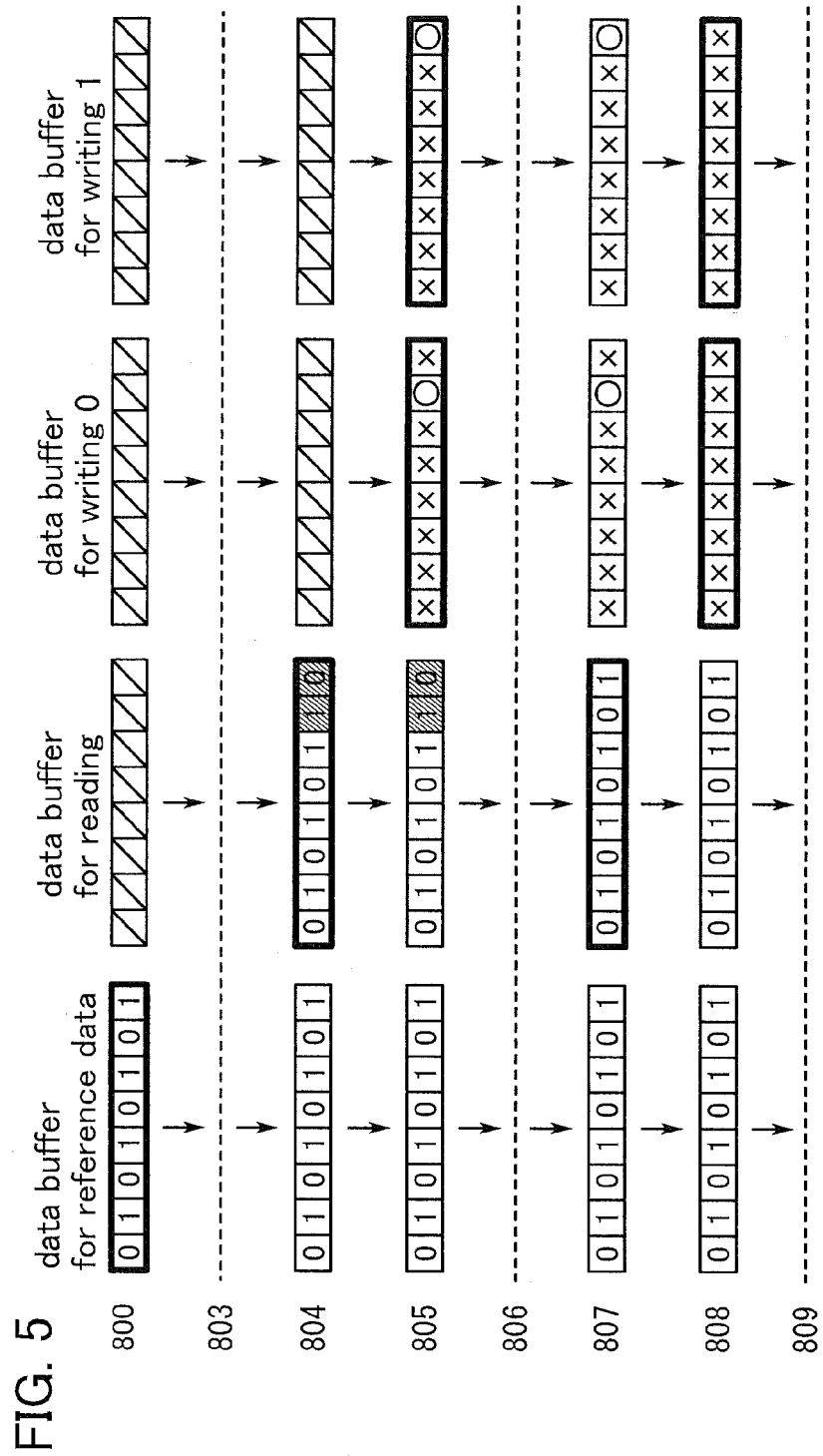
FIG. 5 schematically illustrates the flow of data written into a second memory portion.

Note that in the case where a memory element included in the first memory portion is formed using a bulk semiconductor substrate, for example, before the operation of writing new data into the memory element, data which has been already stored needs to be erased. FIG. 5 schematically illustrate, as an example, the flow of data written into the second memory portion in the operation of writing data into the first memory portion where the existing data is erased.

FIG. 5 is different from FIG. 4 in that the existing data is erased in the first memory portion before the operation of writing new data. Therefore, it is not necessary that data which has already been held in the first memory portion and data to be written be compared to each other before the operation of writing data into the first memory portion. In FIG. 5, reference data transmitted from the control circuit is written into the data buffer for reference data (800: reference data writing), and then, the reference data is written into the first memory portion (803: execution of writing).

Note that in the case of FIG. 5, the writing of the reference data into the data buffer for reference data (800: reference data writing) is not necessarily performed before the writing of the reference data into the first memory portion (803: execution of writing). The writing of the reference data into the data buffer for reference data (800: reference data writing) may be performed after the writing of the reference data into the first memory portion (803: execution of writing).

In the case of FIG. 4, the writing of the reference data into the first memory portion is performed in accordance with the comparison data. However, in the case of FIG. 5, the comparison data is not necessary because data in all bit positions needs to be written.

After the writing of the reference data into the first memory portion is finished, the verifying operation is performed in order to verify whether the data is normally written into the first memory portion. The operation subsequent to the reading of the data stored in the first memory portion and the writing of the data into the data buffer for reading (804: data reading) is similar to that in FIG. 4; thus, the description is omitted.

However, in the case of FIG. 5, when data in a bit position where a defect in writing occurs is written again into the first memory portion, charge accumulated in a floating gate of a transistor used as a memory element needs to be taken out. Specifically, in the case of FIG. 5, when data having a digital value 1 is written into a portion where data having a digital value 0 is to be written, data written in all memory cells is erased by taking out the charge. In contrast, when data having a digital value 0 is written into a portion where data having a digital value 1 is to be written, it is not necessary to perform data erasing because the amount of charge accumulated in the floating gate is not so large as to affect the next operation of writing data.

In this embodiment, the operation of a memory element is described on the assumption that a digital value 1 represents a state where the amount of charge is large and a digital value 0 represents a state where the amount of charge is small in the memory element. However, the relation between the amount of charge and the digital value is not limited thereto. For example, a digital value 0 may represent a state where the amount of charge is large and a digital value 1 may represent a state where the amount of charge is small.

A feature of one embodiment of the present invention is that, in the second memory portion, a transistor with extremely low off-state current or extremely low leakage current is used as a switching element for controlling the accumulation or the holding of charge in the memory element. Therefore, in the second memory portion, charge can be prevented from leaking from the memory element, and data can be held for a long period of time as compared to the case of using a DRAM. Further, it is not necessary to supply voltage all the time when data is held, which is different from the case of using a register or an SRAM. Thus, as shown in FIG. 4 and FIG. 5, the data buffer for reading, the data buffer for writing 0, and the data buffer for writing 1 can hold stored data during the verifying operation, without the supply of power source voltage and the refresh operation. Further, as shown in FIG. 4 and FIG. 5, the data buffer for reference data can hold stored data during the operation of writing data into the first memory portion, without the supply of power source voltage and the refresh operation. Therefore, in the memory device according to one embodiment of the present invention, power consumption in data writing can be suppressed as compared to the case of using a DRAM, an SRAM, or a register.

In this embodiment, the operation of a memory device is described on the assumption that data with a binary digital value is used in the second memory portion; however, the memory device of the present invention can also use multi-valued data which has three or more values. In the case where multi-valued data which has three or more values is used, since the difference in the amount of charge held in a memory element becomes smaller as the number of values is increased to four, five, and so on. Thus, if a slight amount of off-state current exists, it is difficult to maintain the correctness of data, and a holding period tends to be short. However, in one embodiment of the present invention, since a transistor whose off-state current or leakage current is drastically reduced is used as a switching element, generation of off-state current can be prevented effectively as compared to a transistor including silicon. Accordingly, the shortening of a holding period due to value multiplexing can be suppressed. Further, with the value multiplexing, the memory capacity of the second memory portion can be increased while an enlargement of the area of the memory device is prevented.

This embodiment can be implemented by being combined as appropriate with any of the above-described embodiments.
(Embodiment 3)

In this embodiment, a structure of the second memory portion and the operation thereof are described.

Figure 6:
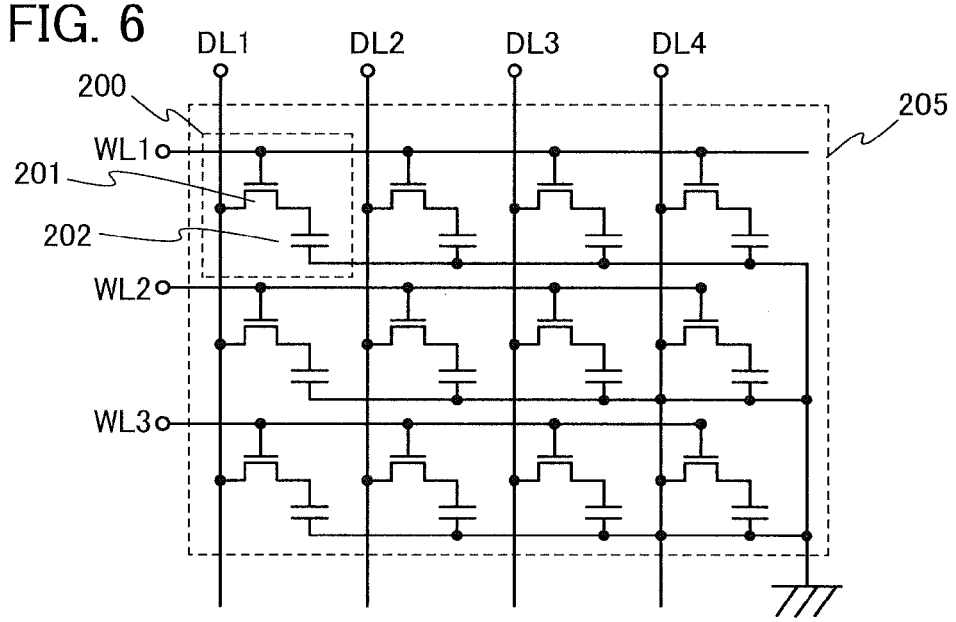
FIG. 6 illustrates a structure of a second memory portion.

FIG. 6 illustrates an example of the circuit diagram of a second memory portion 205 including a plurality of memory cells 200 one of which is shown in FIG. 2A. For the structure of the memory cell 200, the description in Embodiment 1 can be referred to.

In the second memory portion 205 shown in FIG. 6, a variety of wirings such as a plurality of word lines WL and a plurality of data lines DL are provided, and a signal or a fixed potential from a driver circuit of the second memory portion 205 is supplied to each memory cell 200 through the wirings. The number of the wirings can be determined by the number of the memory cells 200 and arrangement of the memory cells 200.

Specifically, the second memory portion 205 shown in FIG. 6 is an example in which memory cells are connected in a matrix with three rows and four columns and word lines WL1 to WL3 and data lines DL1 to DL4 are arranged.

Next, the operation of the second memory portion 205 shown in FIG. 6 is described.

First, the operation of the second memory portion 205 in data writing is described. In data writing, when a signal with a pulse is input to the word line WL1, the potential of the pulse, specifically, a high-level potential, is supplied to a gate electrode of each transistor 201 connected to the word line WL1. Thus, each transistor 201 whose gate electrode is connected to the word line WL1 is turned on.

Then, signals including data are input to the data lines DL1 to DL4. Needless to say, the levels of the potentials of the signals input to the data lines DL1 to DL4 are varied depending on data. A potential input to each of the data lines DL1 to DL4 is supplied, through each transistor 201 which is on, to one of electrodes of a capacitor 202 connected to each transistor 201 which is on. The amount of charge accumulated in the capacitor 202 is controlled in accordance with the potential of the signal, whereby data is written into the capacitor 202.

When the input of the signal with the pulse to the word line WL1 is finished, each transistor 201 whose gate electrode is connected to the word line WL1 is turned off. Then, signals with pulses are sequentially input to the word line WL2 and the word line WL3, and the above operation is similarly repeated in a memory cell 200 with the word line WL2 and a memory cell 200 with the word line WL3.

Then, the operation of the second memory portion 205 in data holding is described. In data holding, potentials with levels at which the transistor 201 is turned off, specifically, low-level potentials, are supplied to all of the word lines WL1 to WL3. Since the transistor 201 has extremely low off-state current as described above, charge accumulated in the capacitor 202 is difficult to leak. Thus, data can be held for a long period of time as compared to the case where a semiconductor material such as silicon is used for the transistor 201.

Then, the operation of the second memory portion 205 in data reading is described. In data reading, signals with pulses are sequentially input to the word lines WL1 to WL3 in a manner similar to that in data writing. When the potential of the pulse, specifically, a high-level potential, is supplied to a gate electrode of each transistor 201 connected to the word line WL1, each transistor 201 connected to the word line WL1 is turned on.

When each transistor 201 connected to the word line WL 1 is turned on, charge accumulated in the capacitor 202 connected to the transistor 201 which is on is taken out through the data lines DL. The difference in the amount of charge is read, whereby data can be read.

Note that a reading circuit is connected to an end of each data line DL, and a signal output from the reading circuit includes data which is actually read from the second memory portion.

Although in this embodiment, a driving method in which writing, holding, and reading of data are sequentially performed in a plurality of memory cells 200 is described, the present invention is not limited thereto. Only a memory cell 200 with the specified address may be subjected to the above operation.

FIG. 6 illustrates, as an example, the second memory portion 205 in which three wirings including the data line DL, the word line WL, and a wiring for supplying a fixed potential to an electrode of the capacitor 202 are connected to each memory cell 200. However, in one embodiment of the present invention, the number of wirings included in each memory cell is not limited to this. The number of wirings and the connection structure may be determined as appropriate so that a signal for controlling switching of the transistor 201, a signal for controlling the amount of charge of the capacitor 202, and a fixed potential can be supplied to each memory cell 200 and a potential including the amount of charge accumulated in the capacitor 202 as data can be transmitted to the driver circuit.

This embodiment can be implemented by being combined as appropriate with any of the above-described embodiments.

(Embodiment 4)

In this embodiment, a structure of the second memory portion and the operation thereof are described.

Figure 7:
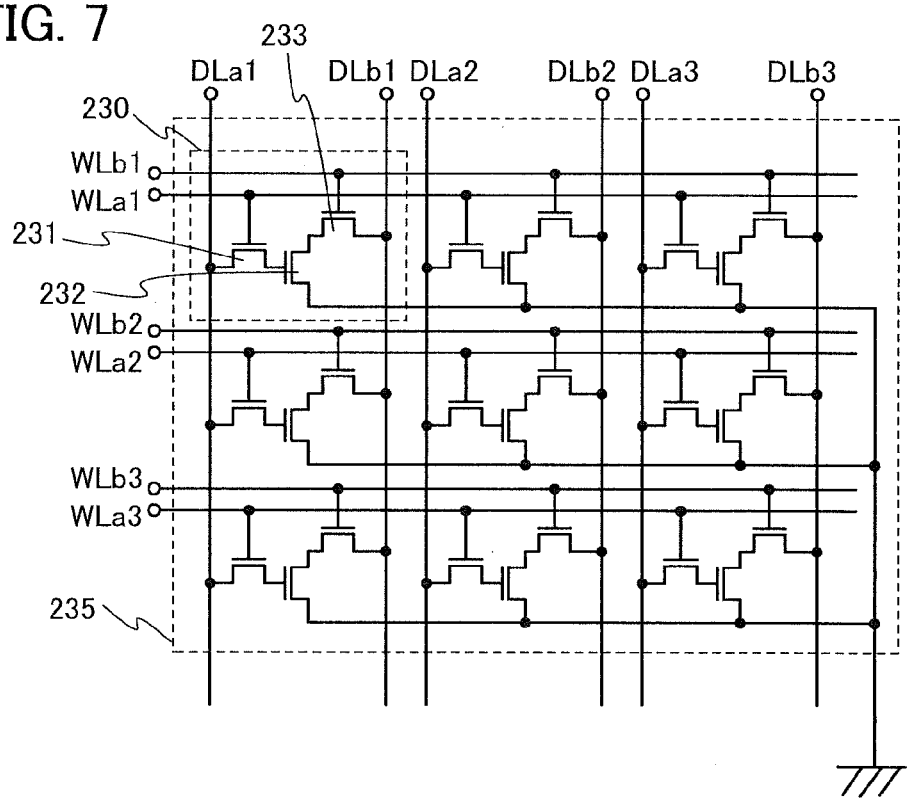
FIG. 7 illustrates a structure of a second memory portion.

FIG. 7 illustrates an example of the circuit diagram of a second memory portion 235 including a plurality of memory cells 230 one of which is shown in FIG. 2D. For the structure of the memory cell 230, the description in Embodiment 1 can be referred to.

In the second memory portion 235 shown in FIG. 7, a variety of wirings such as a plurality of first word lines WLa, a plurality of second word lines WLb, a plurality of first data lines DLa, and a plurality of second data lines DLb are provided, and a signal or a fixed potential from a driver circuit for the second memory portion 235 is supplied to each memory cell 230 through the wirings. The number of the wirings can be determined by the number of the memory cells 230 and arrangement of the memory cells 230.

Specifically, the second memory portion 235 shown in FIG. 7 is an example in which memory cells are connected in a matrix with three rows and three columns and first word lines WLa1 to WLa3, second word lines WLb1 to WLb3, first data lines DLa1 to DLa3, and second data lines DLb1 to DLb3 are arranged.

Figure 8:
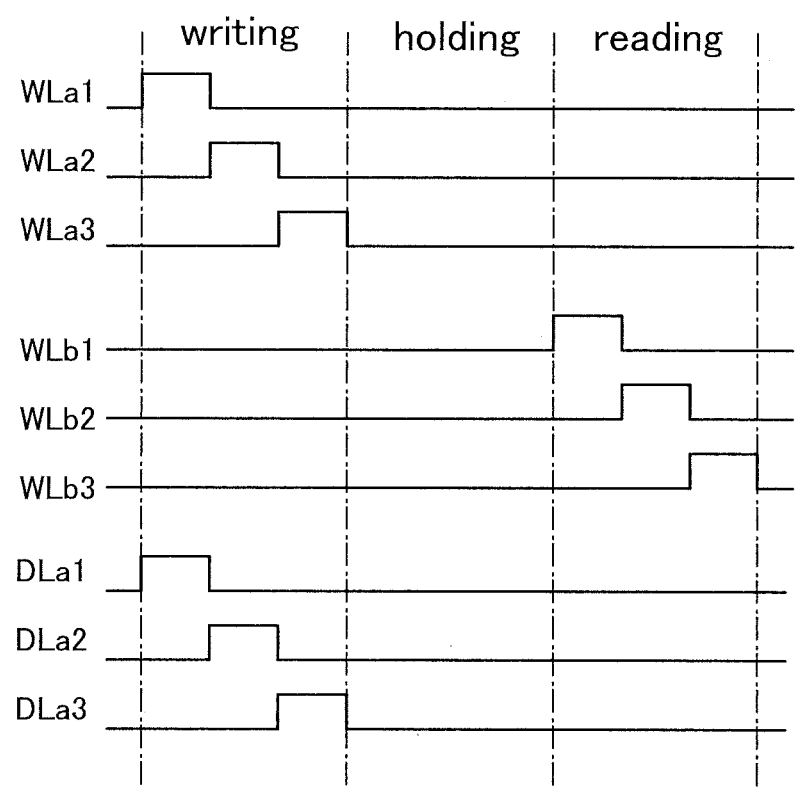
FIG. 8 is a timing chart illustrating a driving method of a second memory portion.

Next, the operation of the second memory portion 235 shown in FIG. 7 is described. FIG. 8 is a timing chart illustrating a change over time in the potentials of signals input to the first word lines WLa1 to WLa3, the second word lines WLb1 to WLb3, and the first data lines DLa1 to DLa3. The timing chart in FIG. 8 illustrates, as an example, the case where transistors 231 to 233 are n-channel transistors and binary data is used.

Note that although rise or fall of the potential of each signal is denoted by a vertical line in the timing chart, it is easily understood by those skilled in the art that the waveform of each potential of a signal practically has a gentle slope due to the influence of a load of a wiring, noise, or the like.

First, the operation of the second memory portion 235 in data writing is described. In data writing, when a signal with a pulse is input to the first word line WLa1, the potential of the pulse, specifically, a high-level potential, is supplied to a gate electrode of each transistor 231 connected to the first word line WLa1. Thus, each transistor 231 whose gate electrode is connected to the first word line WLa1 is turned on. Meanwhile, when low-level potentials are input to the second word lines WLb1 to WLb3, low-level potentials are supplied to gate electrodes of the transistors 233. Thus, the transistors 233 whose gate electrodes are connected to the second word lines WLb1 to WLb3 are turned off.

Then, signals including data are input to the first data lines DLa1 to DLa3. Needless to say, the levels of the potentials of the signals input to the first data lines DLa1 to DLa3 are varied depending on data. A potential input to each of the first data lines DLa1 to DLa3 is supplied, through the transistor 231 which is on, to a gate electrode of a transistor 232. The amount of charge accumulated in a gate capacitance of the transistor 232 is controlled in accordance with the potential of the signal, whereby data is written into the transistor 232.

When the input of a signal with a pulse to the first word line WLa1 is finished, each transistor 231 whose gate electrode is connected to the first word line WLa1 is turned off. Then, signals with pulses are sequentially input to the first word line WLa2 and the first word line WLa3, and the above operation is similarly repeated in a memory cell 230 with the first word line WLa2 and a memory cell 230 with the first word line WLa3.

Then, the operation of the second memory portion 235 in data holding is described. In data holding, potentials with levels at which the transistor 231 is turned off, specifically, low-level potentials, are supplied to all of the first word lines WLa1 to WLa3. Since the transistor 231 has extremely low off-state current as described above, charge accumulated in the transistor 232 is difficult to leak. Thus, data can be held for a long period of time as compared to the case where a semiconductor material such as silicon is used for the transistor 231.

Meanwhile, when low-level potentials are input to the second word lines WLb1 to WLb3, low-level potentials are supplied to the gate electrodes of the transistors 233. Thus, the transistors 233 whose gate electrodes are connected to the second word lines WLb1 to WLb3 remain in an off state.

Then, the operation of the second memory portion 235 in data reading is described. In data reading, low-level potentials are input to all of the first word lines WLa1 to WLa3, and thus, a low-level potential is supplied to the gate electrode of each transistor 231. Therefore, each transistor 231 whose gate electrode is connected to the first word lines WLa1 to WLa3 remains in an off state.

A signal with a pulse is input to the second word line WLb1, and the potential with the pulse, specifically, a high-level potential, is supplied to a gate electrode of each transistor 233 connected to the second word line WLb1. Therefore, each transistor 233 whose gate electrode is connected to the second word line WLb1 is turned on. When each transistor 233 whose gate electrode is connected to the second word line WLb1 is turned on, drain current having an amount corresponding to the amount of charge accumulated in its gate capacitance flows through a transistor 232 connected to each transistor which is on. The difference in the amount of accumulated charge is read from the amount of the drain current of the transistor 232, whereby data can be read from the second data line DLb1.

When the input of a signal with a pulse to the second word line WLb1 is finished, all the transistors 233 whose gate electrodes are connected to the second word line WLb1 are turned off. Then, signals with pulses are sequentially input to the second word line WLb2 and the second word line WLb3, and the above operation is similarly repeated in a memory cell 230 with the second word line WLb2 and a memory cell 230 with the second word line WLb3.

Note that a reading circuit is connected to an end of each of the second data lines DLb1 to DLb3, and a signal output from the reading circuit includes data which is actually read from the second memory portion.

Although in this embodiment, a driving method in which writing, holding, and reading of data are sequentially performed in a plurality of memory cells 230 is described, the present invention is not limited thereto. Only a memory cell 230 with the specified address may be subjected to the above operation.

FIG. 7 illustrates, as an example, the second memory portion 235 in which five wirings including the first word line WLa, the second word line WLb, the first data line DLa, the second data line DLb, and a wiring for supplying a fixed potential to the transistor 232 are connected to each memory cell 230. However, in one embodiment of the present invention, the number of wirings included in each memory cell is not limited to this. The number of wirings and the connection structure may be determined as appropriate so that a signal for controlling switching of the transistor 231, a signal for controlling the amount of charge accumulated in the gate capacitance of the transistor 232, a signal for controlling the switching of the transistor 233, and a fixed potential can be supplied to each memory cell 230 and a potential including the amount of charge accumulated in the gate capacitance as data can be transmitted to the driver circuit.

This embodiment can be implemented by being combined as appropriate with any of the above-described embodiments.

(Embodiment 5)

The levels of potentials read from the second memory portion are determined in accordance with data written into the memory cells. Accordingly, in an ideal view, potentials having the same level should be read from the plurality of memory cells when data with the same digital value is stored in the plurality of memory cells. However, practically, there is a case where the characteristics of transistors functioning as memory elements or transistors functioning as switching elements in reading are varied among the memory cells. In that case, the potentials which are actually read are varied even if all of data to be read has the same digital value, so that the levels of the potentials can be widely distributed. Therefore, it is preferable to provide, in the driver circuit, a reading circuit in which a signal including correct data and having amplitude and waveform processed in accordance with the desired specification can be generated even when a little variation occurs in the potentials read from the second memory portion.

Figure 9:
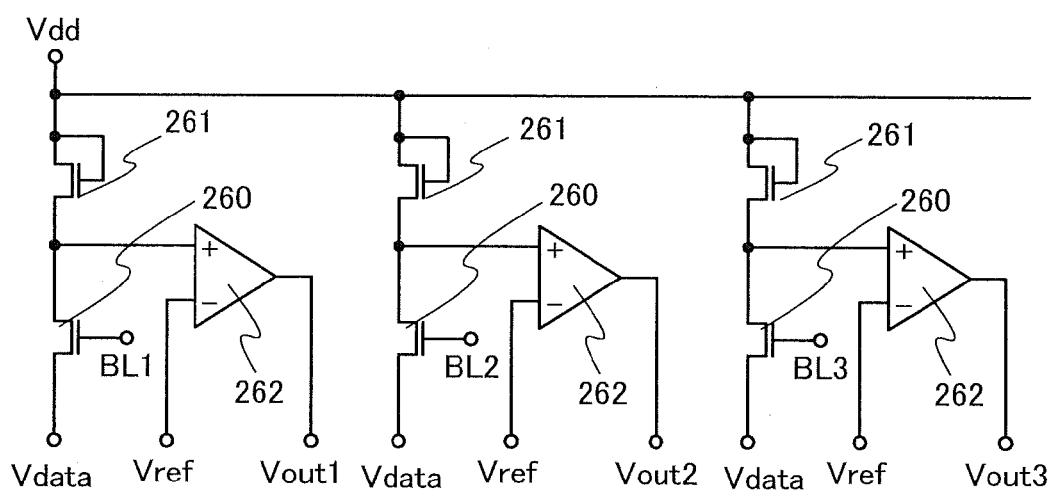
FIG. 9 illustrates a structure of a reading circuit.

FIG. 9 illustrates an example of a circuit diagram of a reading circuit. The reading circuit in FIG. 9 includes transistors 260 which function as switching elements for controlling the input of potentials $V_{data}$ read from the second memory portion to the reading circuit, and transistors 261 which function as resistors. In addition, the reading circuit in FIG. 9 includes operational amplifiers 262.

Specifically, gate electrodes of the transistors 261 are connected to drain electrodes (or drain regions) of the transistors 261, respectively. In addition, a high-level power supply potential $V_{dd}$ is supplied to the gate electrodes and the drain electrodes. Further, source electrodes of the transistors 261 are connected to non-inverting input terminals (+) of the operational amplifiers 262, respectively. Accordingly, the transistors 261 function as resistors connected between nodes to which the power supply potential $V_{dd}$ is supplied and the non-inverting input terminals (+) of the operational amplifiers 262. Note that although in FIG. 9, a transistor whose gate electrode is connected to the drain electrode is used as a resistor, the present invention is not limited to this. Alternatively, an element functioning as a resistor can be used.

Further, gate electrodes of the transistors 260 which function as switching elements are connected to bit lines BL1 to BL3. Then, the supply of potentials $V_{data}$ to source electrodes of the transistors 260 is controlled in accordance with potentials of the bit lines BL1 to BL3.

For example, when the transistor 260 connected to the bit line BL1 is turned on, a potential obtained by dividing the potential $V_{data}$ and the power supply potential $V_{dd}$ using resistors, i.e., the transistor 260 and the transistor 261, is supplied to the non-inverting input terminal (+) of the operational amplifier 262. The level of the power supply potential $V_{dd}$ is fixed; thus, the level of the potential obtained by the resistor division reflects the level of the potential $V_{data}$, i.e., a digital value of read data.

In contrast, a reference potential $V_{ref}$ is supplied to inverting input terminals (−) of the operational amplifiers 262. The levels of the potentials of output terminals $V_{out}$ can be varied depending on the level of the potential with respect to the reference potential $V_{ref}$. Thus, a signal which indirectly includes data can be obtained.

Note that even if data with the same value is stored in memory cells, fluctuation in levels of the read potential $V_{data}$ occurs due to variation in characteristics of the memory cells, so that the levels of potentials can be widely distributed sometimes. Thus, the level of the reference potential $V_{ref}$ is determined in consideration of fluctuation in levels of the potential $V_{data}$ of a node in order to read the value of data correctly.

Since FIG. 9 illustrates an example of a reading circuit in the case of using a binary digital value, one operational amplifier used for reading data is used for each node to which the potential $V_{data}$ is supplied. However, the number of operational amplifiers is not limited to this. When n-valued data (n is a natural number of 2 or more) is used, the number of operational amplifiers used for each node to which the potential $V_{data}$ is supplied is (n−1).

This embodiment can be implemented by being combined as appropriate with any of the above-described embodiments.
(Embodiment 6)

In this embodiment, a structure of a driver circuit in a memory device according to one embodiment of the present invention is described.

Figure 10:
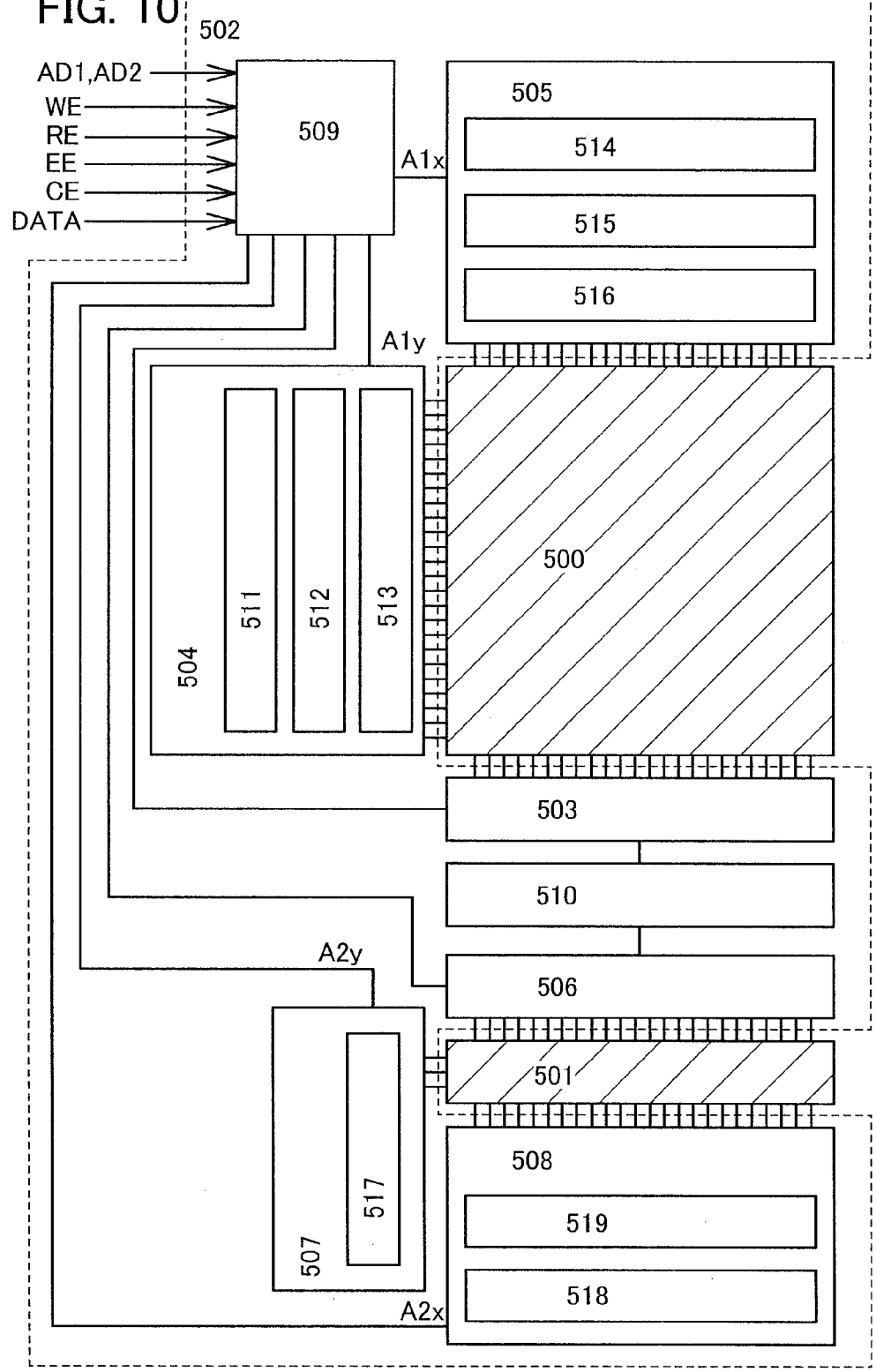
FIG. 10 illustrates a structure of a memory device.

FIG. 10 illustrates, as an example, a block diagram of a structure of a memory device according to one embodiment of the present invention. Note that in the block diagram in FIG. 10, circuits in the memory device are classified in accordance with their functions and separated blocks are illustrated. However, it is difficult to classify actual circuits according to their functions completely and it is possible for one circuit to have a plurality of functions.

The memory device in FIG. 10 includes a first memory portion 500, a second memory portion 501, and a driver circuit 502. The driver circuit 502 includes a reading circuit 503 which generates a signal with data read from the first memory portion 500; a word line driver circuit 504 which selects a memory cell included in the first memory portion 500 every row; and a data line driver circuit 505 which controls writing and erasing of data in a memory cell selected in the first memory portion 500. Further, the driver circuit 502 includes a reading circuit 506 which generates a signal with data read from the second memory portion 501; a word line driver circuit 507 which selects a memory cell included in the second memory portion 501 every row; and a data line driver circuit 508 which controls writing of data in a memory cell selected in the second memory portion 501. Furthermore, the driver circuit 502 includes a control circuit 509 which controls the operation of the reading circuit 503, the word line driver circuit 504, the data line driver circuit 505, the reading circuit 506, the word line driver circuit 507, and the data line driver circuit 508; and a comparison circuit 510 which compares data in the verifying operation.

In the memory device shown in FIG. 10, the word line driver circuit 504 includes a decoder 511, a level shifter 512, and a buffer 513, and the data line driver circuit 505 includes a decoder 514, a level shifter 515, and a selector 516. In the memory device shown in FIG. 10, the word line driver circuit 507 includes a decoder 517, and the data line driver circuit 508 includes a decoder 518 and a selector 519.

Note that it is acceptable as long as a memory device according to one embodiment of the present invention includes at least the first memory portion 500, the second memory portion 501, and the comparison circuit 510. Further, the memory device according to one embodiment of the present invention includes, in its category, a memory module in which the first memory portion 500, the second memory portion 501, and the comparison circuit 510 are connected to part of or all components except for the comparison circuit 510 in the driver circuit 502. The memory module may be provided with a connection terminal which can be mounted on a printed wiring board or the like and may be protected with resin or the like, that is, may be packaged.

The first memory portion 500, the second memory portion 501, and the comparison circuit 510 may be formed using one substrate. Alternatively, any one of the first memory portion 500, the second memory portion 501, and the comparison circuit 510 may be formed using a substrate different from a substrate for the others, or all of them may be formed using different substrates. The same can be said for components in the driver circuit 502 other than the comparison circuit 510. In addition to all of the first memory portion 500, the second memory portion 501, and the comparison circuit 510, the components in the driver circuit 502 other than the comparison circuit 510 may be formed using one substrate. Alternatively, the components in the driver circuit 502 other than the comparison circuit 510 may be formed using a substrate different from a substrate for any one of the first memory portion 500, the second memory portion 501, and the comparison circuit 510, or may be formed using a substrate different from a substrate for all of the first memory portion 500, the second memory portion 501, and the comparison circuit 510.

In the case of using different substrates, electrical connection can be ensured with the use of an FPC (flexible printed circuit) or the like. In that case, part of the driver circuit 502 may be connected to an FPC by COF (chip on film). Further, electrical connection can be ensured by COG (chip on glass).

When a signal AD1 having an address (A1x, A1y) of the first memory portion 500 as data is input to the memory device, the control circuit 509 transmits the data A1x which is data related to a column direction in the address and the data A1y which is data related to a row direction in the address to the data line driver circuit 505 and the word line driver circuit 504, respectively. In addition, the control circuit 509 transmits a signal DATA including reference data input to the memory device to the data line driver circuit 505.

Further, when a signal AD2 having an address (A2x, A2y) of the second memory portion 501 as data is input to the memory device, the control circuit 509 transmits the data A2x which is data related to a column direction in the address and the data A2y which is data related to a row direction in the address to the data line driver circuit 508 and the word line driver circuit 507, respectively.

Selection of operation of writing data, operation of reading data, or operation of erasing data in the first memory portion 500 is performed in accordance with a signal RE (read enable), a signal WE (write enable), a signal EE (erase enable), or the like which is supplied to the control circuit 509. Further, selection of operation of writing data or operation of reading data in the second memory portion 501 is also performed in accordance with the signal RE (read enable), the signal WE (write enable), or the like which is supplied to the control circuit 509. Furthermore, a signal CE (chip enable) for selecting either the first memory portion 500 or the second memory portion 501 may be input to the control circuit 509. The operation selected in accordance with the signal RE or the signal WE is performed in either the first memory portion 500 or the second memory portion 501 which is selected in accordance with the signal CE.

In the first memory portion 500, when the writing operation is selected in accordance with the signal WE, a signal for selecting memory cells corresponding to the address A1y is generated in the decoder 511 included in the word line driver circuit 504 in response to an instruction from the control circuit 509. The amplitude of the signal is adjusted by the level shifter 512, and then, the waveform of the signal is processed in the buffer 513 and input to the first memory portion 500. In the data line driver circuit 505, a signal for selecting memory cells corresponding to the address A1x among memory cells selected in the decoder 514 is generated in response to an instruction from the control circuit 509. The amplitude of the signal is adjusted by the level shifter 515, and then input to the selector 516. In the selector 516, the signal DATA is sampled in accordance with the input signal, and the sampled signal is input to a memory cell corresponding to the address (A1x, A1y).

In the first memory portion 500, when the reading operation is selected in accordance with the signal RE, a signal for selecting memory cells corresponding to the address A1y is generated in the decoder 511 included in the word line driver circuit 504 in response to an instruction from the control circuit 509. The amplitude of the signal is adjusted by the level shifter 512, and then, the waveform of the signal is processed in the buffer 513 and input to the first memory portion 500. In the reading circuit 503, memory cells corresponding to the address A1x are selected among memory cells selected by the decoder 511 in response to an instruction from the control circuit 509. Data stored in the memory cell corresponding to the address (A1x, A1y) is read, and a signal including the data is generated.

In the first memory portion 500, when the erasing operation is selected in accordance with the signal EE, a signal for selecting memory cells corresponding to the address A1y is generated in the decoder 511 included in the word line driver circuit 504 in response to an instruction from the control circuit 509. The amplitude of the signal is adjusted by the level shifter 512, and then, the waveform of the signal is processed in the buffer 513 and input to the first memory portion 500. In the data line driver circuit 505, a signal for selecting memory cells corresponding to the address A1x among memory cells selected in the decoder 514 is generated in response to an instruction from the control circuit 509. The amplitude of the signal is adjusted by the level shifter 515, and then input to the selector 516. In the selector 516, a signal for erasing data is input to the memory cell corresponding to the address (A1x, A1y) in accordance with the input signal.

In the second memory portion 501, when the writing operation is selected in accordance with the signal WE, a memory cell corresponding to the address A2y of the second memory portion 501 is selected by the decoder 517 included in the word line driver circuit 507 in response to an instruction from the control circuit 509. In the data line driver circuit 508, a signal for selecting memory cells corresponding to the address A2x among memory cells selected by the decoder 518 is generated in response to an instruction from the control circuit 509. In the selector 519, data is sampled in accordance with the signal, and the sampled signal is input to a memory cell corresponding to the address (A2x, A2y).

The data input to the second memory portion 501 is varied depending on a function of a data buffer included in the second memory portion 501. For example, data read from the first memory portion 500 by the reading circuit 503, reference data included in the signal DATA input from the control circuit 509, comparison data from the comparison circuit 510, and the like are input to the second memory portion 501.

In the second memory portion 501, when the reading operation is selected in accordance with the signal RE, memory cells corresponding to the address A2y in the second memory portion 501 are selected by the decoder 517 included in the word line driver circuit 507 in response to an instruction from the control circuit 509. In the reading circuit 506, memory cells corresponding to the address A2x among memory cells selected by the decoder 517 is selected in response to an instruction from the control circuit 509. Data stored in the memory cell corresponding to the address (A2x, A2y) is read, and a signal including the data is generated.

In the comparison circuit 510, data read from the first memory portion 500 by the reading circuit 503 and the reference data read from the second memory portion 501 by the reading circuit 506 are compared to each other. Comparison data including the comparison result as data is transmitted to the second memory portion 501.

Although FIG. 10 illustrates the case where the data read from the first memory portion 500 and the reference data read from the second memory portion 501 are directly compared to each other in the comparison circuit 510, one embodiment of the present invention is not limited to this structure. The data read from the first memory portion 500 may be stored in the second memory portion 501, and the data may be compared to the reference data stored in the second memory portion 501.

In FIG. 10, the memory device is provided with the word line driver circuit 504 and the data line driver circuit 505 for controlling the operation of the first memory portion 500, and the word line driver circuit 507 and the data line driver circuit 508 for controlling the operation of the second memory portion 501. However, one embodiment of the present invention is not limited to this structure. One word line driver circuit may have functions of the word line driver circuit 504 and the word line driver circuit 507. Specifically, in the case of FIG. 10, one decoder can have functions of the decoder 511 and the decoder 517. Alternatively, one data line driver circuit can have functions of the data line driver circuit 505 and the data line driver circuit 508. Specifically, in the case of FIG. 10, one decoder can have functions of the decoder 514 and the decoder 518. Further, one selector can have functions of the selector 516 and the selector 519.

This embodiment can be implemented by being combined as appropriate with any of the above-described embodiments.

(Embodiment 7)

In this embodiment, a method of measuring the off-state current of a transistor including a highly-purified oxide semiconductor film and the result thereof will be described.

Figure 11:
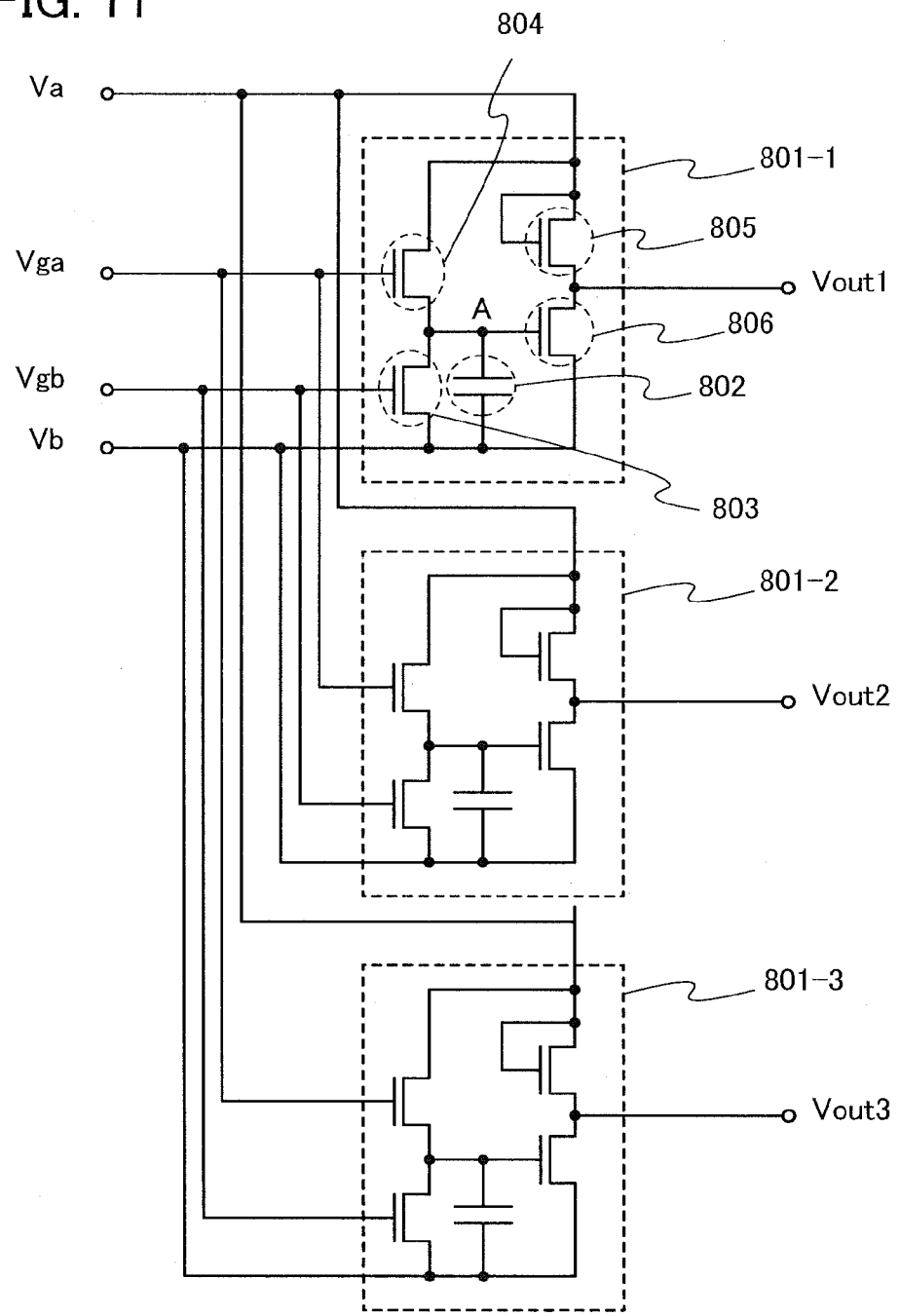
FIG. 11 illustrates a structure of a circuit for measurement.

FIG. 11 illustrates the structure of a measurement circuit which was used in measuring. The measurement circuit in FIG. 11 includes a transistor having a highly-purified oxide semiconductor film as a switching element for holding charge in a capacitor. With the measurement circuit, the off-state current of the transistor was measured by the change of the amount of charge in the capacitor per unit time.

Specifically, the measurement circuit in FIG. 11 has a structure in which measuring systems 801-1 to 801-3 for measuring off-state current are connected in parallel. The measuring systems 801-1 to 801-3 each include a capacitor 802 and a transistor 803 to be measured. The measuring systems 801-1 to 801-3 each include transistors 804 to 806.

In each measuring system, a gate electrode of the transistor 803 is connected to a node supplied with a potential $V_{gb}$. A source electrode of the transistor 803 is connected to a node supplied with a potential $V_b$ and a drain electrode of the transistor 803 is connected to a node A. A gate electrode of the transistor 804 is connected to a node supplied with a potential $V_{ga}$. A source electrode of the transistor 804 is connected to the node A and a drain electrode of the transistor 804 is connected to a node supplied with a potential $V_a$. A gate electrode and a drain electrode of the transistor 805 are connected to the node supplied with the potential $V_a$. A gate electrode of the transistor 806 is connected to the node A and a source electrode of the transistor 806 is connected to the node supplied with the potential $V_b$. A source electrode of the transistor 805 and a drain electrode of the transistor 806 are connected to each other and potentials of these two electrodes are output from each measuring system as a potential $V_{out1}$, a potential $V_{out2}$, or a potential $V_{out3}$. One of a pair of electrodes of the capacitor 802 is connected to the node A and the other is connected to the node supplied with the potential $V_b$.

In addition, in this embodiment, the transistor 803 to be measured includes a highly-purified 30-nm-thick oxide semiconductor film and a 100-nm-thick gate insulating film. The channel formation region of the transistor 803 had a channel length L of 10 μm and a channel width W of 50 μm. In addition, the capacitances of the capacitors 802 included in the measuring systems were 100 fF, 1 pF, and 3 pF, respectively.

Initialization is performed before measurement. First, the potential $V_{gb}$ has a level high enough to turn the transistor 803 on. Thus, the transistor 803 is turned on, and the node A is supplied with the potential $V_b$, that is, a low-level potential $V_{SS}$. After that, the potential $V_{gb}$ is made to have a level low enough to turn the transistor 803 off. Next, the potential $V_{ga}$ is made to have a level high enough to turn the transistor 804 on. Thus, the node A is supplied with the potential $V_a$, that is, the high-level potential $V_{DD}$, and the potential difference between the low-level potential $V_{SS}$ and the high-level potential $V_{DD}$ is applied between the pair of electrodes of the capacitor 802. After that, the potential $V_{ga}$ is made to have a level low enough to turn the transistor 804 off, so that the transistor 804 is turned off and the node A goes into a floating state.

Next, measuring operation is performed. When measurement is performed, the potential $V_a$ and the potential $V_b$ are each made to have a level with which charge flows to and from the node A. In this embodiment, the potential $V_a$ and the potential $V_b$ were the low-level potential $V_{SS}$. Note that although the potential $V_a$ was temporarily the high-level potential $V_{DD}$ in timing of measuring the potential $V_{out}$, the potential $V_a$ and the potential $V_b$ were kept at the low-level potential $V_{SS}$ except at the above timing.

Since the slight off-state current flow through the transistor 803, the amount of charge held in the node A is changed over time. In addition, since the potential of the node A is changed depending on the change of the amount of charge held in the node A, the levels of the potentials $V_{out1}$ to $V_{out3}$ were changed in accordance with the value of the off-state current of the transistor 803.

Specifically, in the measurement, the potential $V_{DD}$ was 5 V and the potential $V_{SS}$ was 0 V. The potentials $V_{out1}$ to $V_{out3}$ were measured as follows: the potential $V_a$ was basically the potential $V_{SS}$ and was changed to be the potential $V_{DD}$ for 100 msec at intervals of 10 sec to 300 sec.

Figure 12:
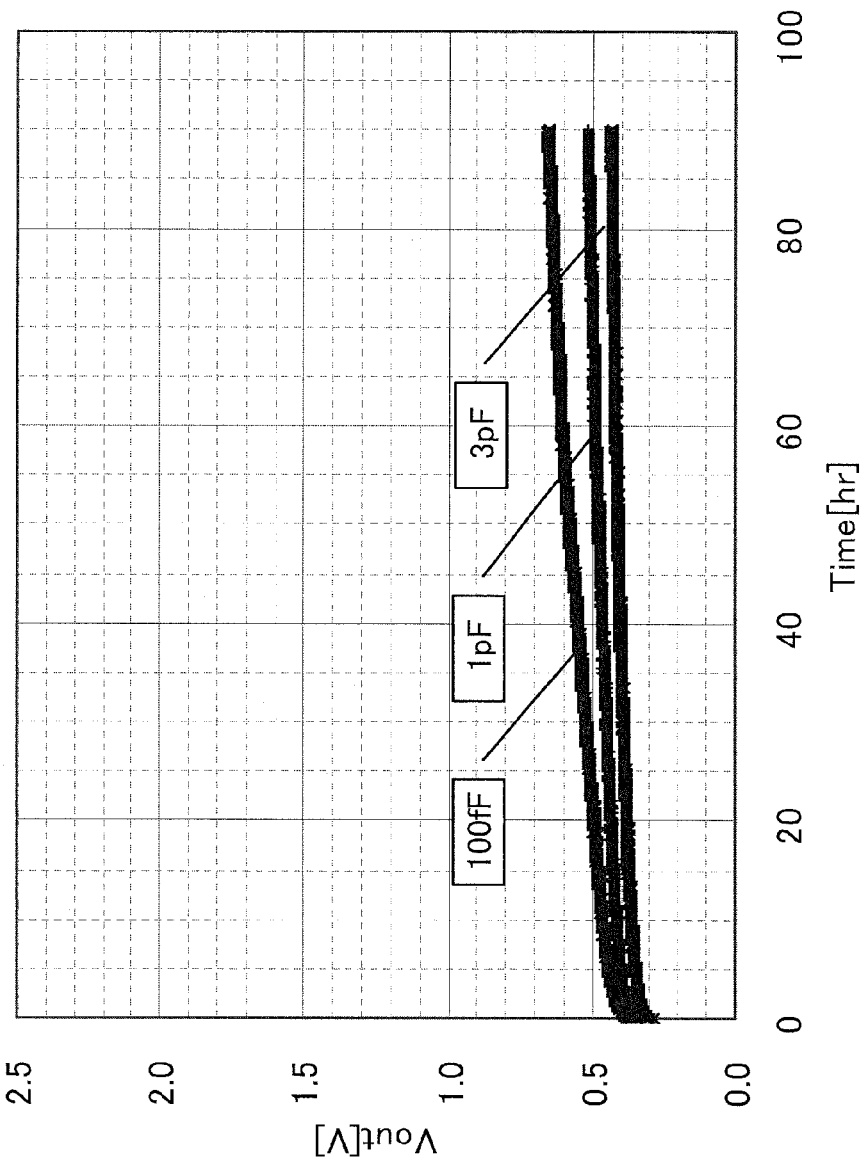
FIG. 12 shows a measurement result (a relation between passing time Time and an output potential $V_{out}$).

FIG. 12 shows the relationship between elapsed time Time in measuring the current and the output potential $V_{out}$. The potential change can be observed after about 90 hours.

The relation between the potential $V_A$ of the node A and the output potential $V_{out}$ is obtained in advance, whereby the potential $V_A$ of the node A can be obtained using the output potential $V_{out}$. In general, the potential $V_A$ of the node A can be expressed as a function of the output potential $V_{out}$ by the following equation.

$$V_A = F(Vout)$$

Charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitances (e.g., the input capacitance of a circuit including the transistor 805 and the transistor 806).

$$Q_A = C_A V_A + const$$

Since a current I of the node A is obtained by differentiating charge flowing to the node A (or charge flowing from the node A) with respect to time, the current I of the node A is expressed by the following equation.

$$I \equiv \frac{\Delta Q_A}{\Delta t} = \frac{C_A \Delta F(Vout)}{\Delta t}$$

In this manner, the current I of the node A can be obtained from the capacitance $C_A$ connected to the node A and the potentials $V_{out1}$ to $V_{out3}$.

Figure 13:
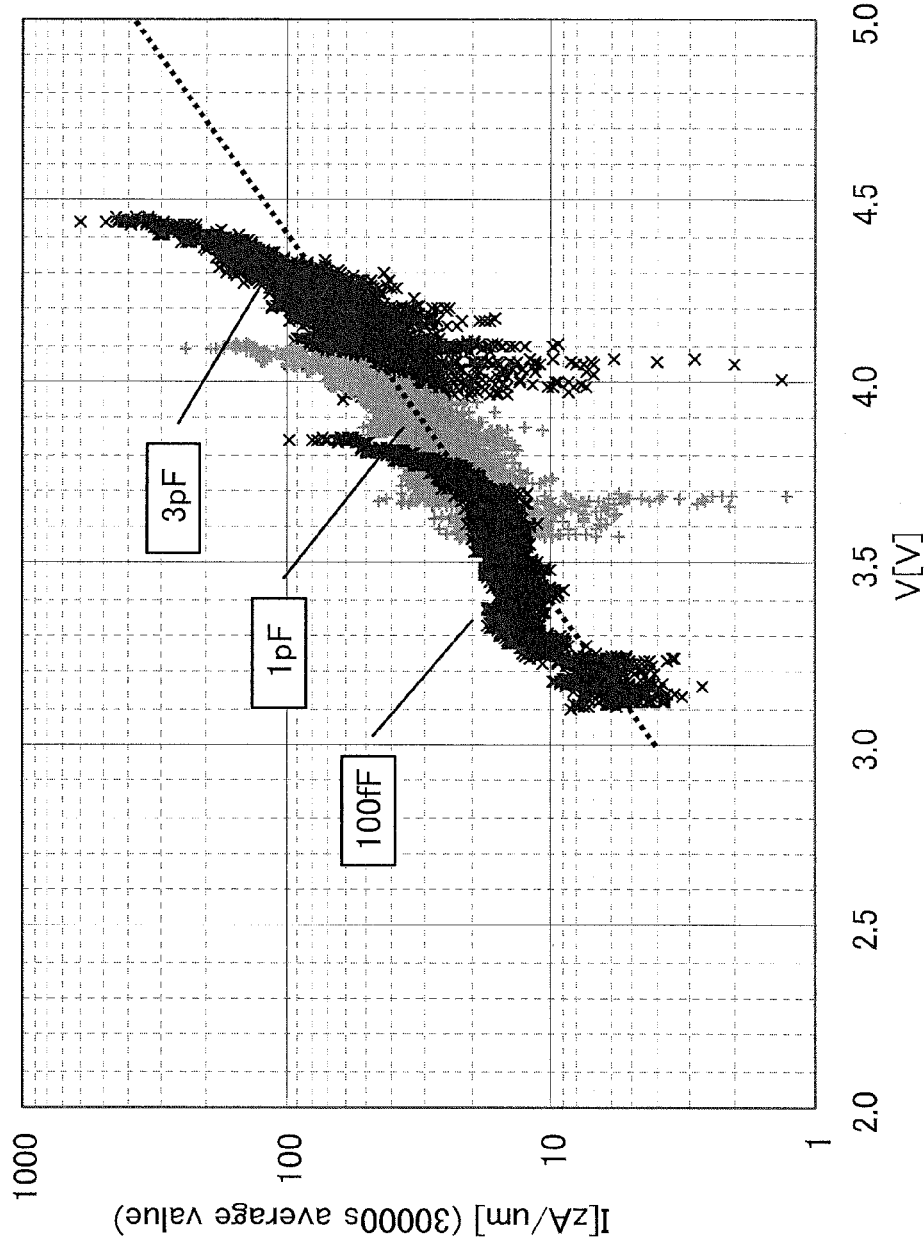
FIG. 13 shows a measurement result (a relation between source-drain voltage V and off-state current I).

FIG. 13 illustrates the off-state current which is calculated in the above measurement of the current. Further, Δt used when the current I flowing through the transistor 803 is about 30,000 seconds. Note that FIG. 13 illustrates the relation between off-state current I and voltage V between a source electrode and a drain electrode. According to FIG. 13, it is found that an off-state current is about 40 zA/μm, where voltage between the source electrode and the drain electrode is 4 V.

In this manner, the oxide semiconductor film is highly purified so that impurities such as moisture or hydrogen except a main component of the oxide semiconductor are contained as little as possible, whereby the operation of the transistor can be favorable.

This embodiment can be implemented by being combined as appropriate with any of the above-described embodiments.

(Embodiment 8)

In this embodiment, an example of a structure of an RF tag, which is one of semiconductor devices of the present invention, is described.

Figure 14:
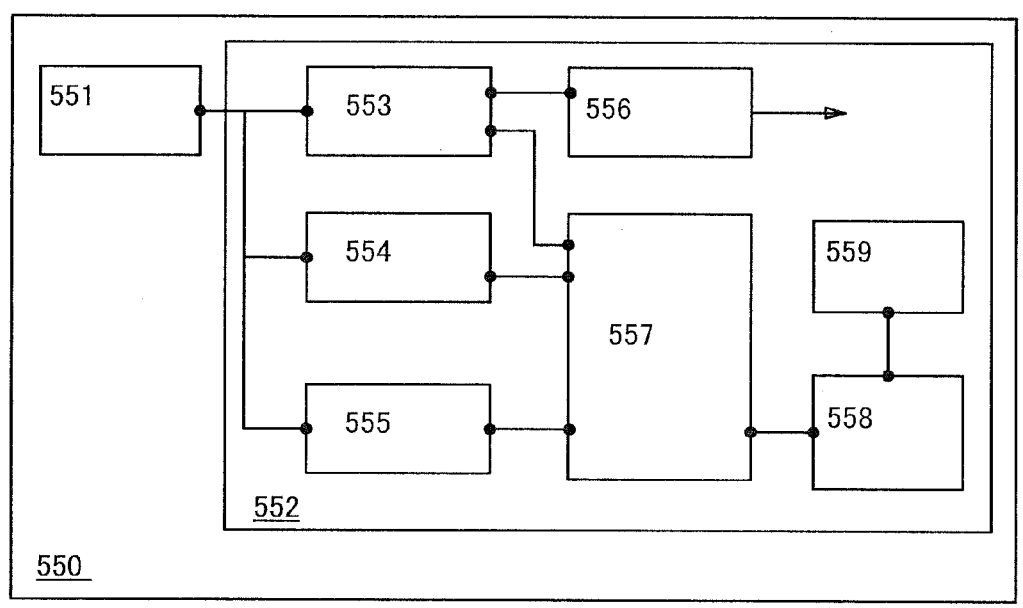
FIG. 14 illustrates a structure of an RF tag.

FIG. 14 is a block diagram illustrating one mode of the RF tag of the present invention. In FIG. 14, an RF tag 550 includes an antenna circuit 551 and an integrated circuit 552. The integrated circuit 552 includes a power supply circuit 553, a demodulation circuit 554, a modulation circuit 555, a regulator 556, an arithmetic circuit 557, a memory device 558, and a boosting circuit 559.

An example of the operation of the RF tag 550 is described. When a radio wave is transmitted from an interrogator, the radio wave is converted into an AC voltage in the antenna circuit 551. In the power supply circuit 553, the AC voltage from the antenna circuit 551 is rectified to generate a voltage for a power supply. The voltage for a power supply, which is generated in the power supply circuit 553, is fed to the arithmetic circuit 557 and the regulator 556. After stabilizing the voltage for a power supply from the power supply circuit 553 or after adjusting the level thereof, the regulator 556 supplies the voltage to circuits such as the demodulation circuit 554, the modulation circuit 555, the arithmetic circuit 557, the memory device 558, or the boosting circuit 559 in the integrated circuit 552.

The demodulation circuit 554 demodulates an AC signal received by the antenna circuit 551 and outputs the signal to the arithmetic circuit 557 of the next stage. The arithmetic circuit 557 performs arithmetic processing in accordance with the signal input from the demodulation circuit 554 and generates another signal. In the above arithmetic processing, the memory device 558 can be used as a primary cache memory or a secondary cache memory. Further, the arithmetic circuit 557 analyzes the signal input from the demodulation circuit 554, and data in the memory device 558 is output or an instruction in the memory device 558 is executed in response to an instruction transmitted from the interrogator. The signal output from the arithmetic circuit 557 is encoded and transmitted to the modulation circuit 555. The modulation circuit 555 modulates a radio wave received by the antenna circuit 551 in accordance with the signal. The radio wave modulated in the antenna circuit 551 is received by the interrogator.

In this manner, communication between the RF tag 550 and the interrogator is performed by modulating a radio wave used as a carrier (a carrier wave). As the carrier, there are radio waves with frequencies of 125 kHz, 13.56 MHz, 950 MHz, and the like, which vary depending on the standard. A modulation method includes various methods such as amplitude modulation, frequency modulation, and phase modulation, depending on the standard; however, any modulation may be employed as long as it is based on the standard.

A transmission method of signals can be classified into an electromagnetic coupling method, an electromagnetic induction method, a micro-wave method, and the like in accordance with a wavelength of the carrier.

The boosting circuit 559 boosts voltage output from the regulator 556 and supplies the voltage to the memory device 558.

A feature of one embodiment of the present invention is that the memory device 558 has the structure described in the foregoing embodiment and that the occurrence of a defect in writing can thus be suppressed while the power consumption is low. Thus, in the RF tag 550 according to one embodiment of the present invention, the power consumption of the integrated circuit 552 is low, whereby a communication distance between the RF tag 550 and the interrogator can be made long. With the use of the RF tag 550 according to one embodiment of the present invention, the occurrence of a defect in writing in the memory device 558 can be suppressed. Thus, reliability of the RF tag 550 can be increased.

In this embodiment, a structure of the RF tag 550 including the antenna circuit 551 is described; however, the RF tag according to one embodiment of the present invention does not necessarily include an antenna circuit. In addition, the RF tag illustrated in FIG. 14 may be provided with an oscillation circuit or a secondary battery.

This embodiment can be implemented in combination with any of the above embodiments or embodiments as appropriate.

(Embodiment 9)

In this embodiment, an example of a mobile memory medium which is one of semiconductor devices using memory devices according to one embodiment of the present invention will be described.

Figure 15A:
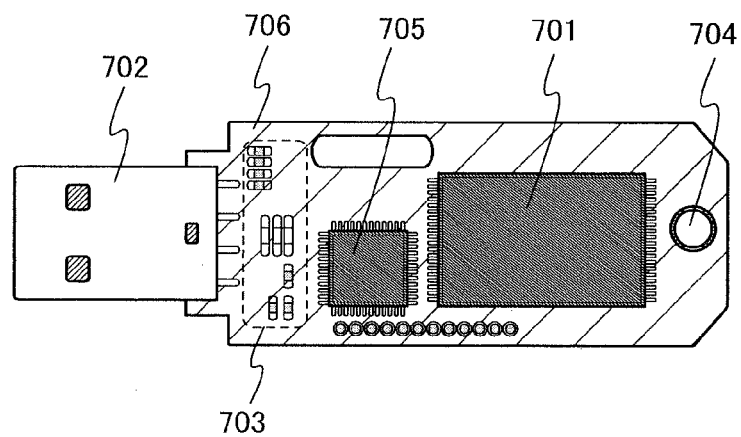
FIGS. 15A and 15B illustrate a structure of a memory medium.

FIG. 15A illustrates a structure of a memory medium according to one embodiment of the present invention, as an example. In the memory medium in FIG. 15A, the following components are mounted on a printed wiring board 706: a memory device 701 according to one embodiment of the present invention; a connector 702 which performs electrical connection between a driving device and the memory medium; an interface 703 which performs a signal process on each signal input or output through the connector 702 in accordance with the various signals; a light-emitting diode 704 which lights in accordance with operation of the memory medium or the like; and a controller 705 which controls operation of circuits and semiconductor elements in the memory medium such as the memory device 701, the interface 703, and the light-emitting diode 704. Further, a quartz oscillator which is used for generating a clock signal for controlling the operation of the controller 705, a regulator for controlling the level of the power supply voltage in the memory medium, or the like may additionally be provided.

Figure 15B:
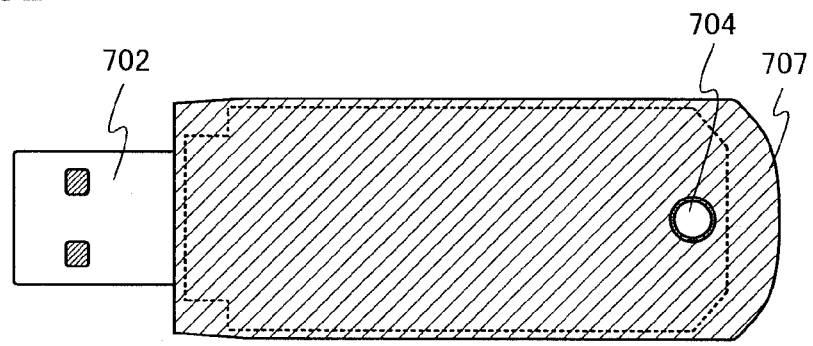

As illustrated in FIG. 15B, the printed wiring board 706 in FIG. 15A may be protected by being covered with a cover material 707 using resin or the like so as to expose part of the connector 702 and part of the light-emitting diode 704.

Since in the memory device 701 according to one embodiment of the present invention, power consumption in operation can be suppressed, reduction in power consumption of the memory medium using the memory device 701, and further, reduction in power consumption of a driving device connected to a recording medium can be realized. In the memory device 701 according to one embodiment of the present invention, the occurrence of a defect in data writing can be suppressed; thus, reliability of the memory medium can be increased.

This embodiment can be implemented by being combined as appropriate with any of the above-described embodiments.

EXAMPLE 1

A semiconductor device according to one embodiment of the present invention is used, so that a highly reliable electronic device and an electronic device with low power consumption can be provided. In particular, in the case where a portable electronic device which has difficulty in continuously receiving power, an advantage in increasing the continuous duty period can be obtained when a semiconductor device with low power consumption according to one embodiment of the present invention is added as a component of the device.

Figure 16A:
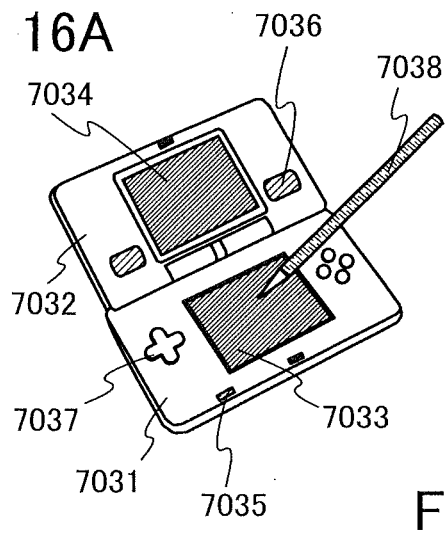
FIGS. 16A to 16C illustrate structures of electronic devices.
Figure 16B:
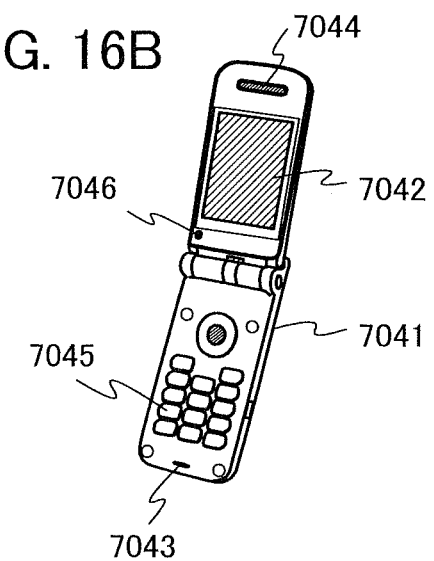
Figure 16C:
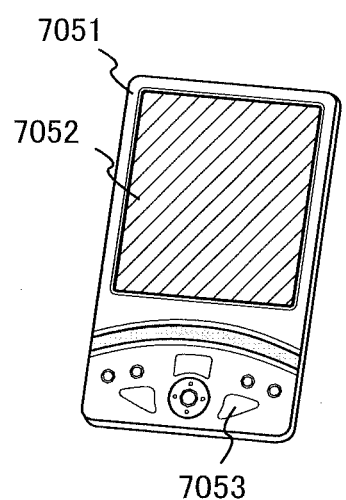

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 16A to 16C illustrate specific examples of these electronic devices.

FIG. 16A illustrates a portable game machine including a housing 7031, a housing 7032, a display portion 7033, a display portion 7034, a microphone 7035, speakers 7036, an operation key 7037, a stylus 7038, and the like. The semiconductor device according to one embodiment of the present invention can also be used for an integrated circuit for controlling the driving of the portable game machine. With the use of the semiconductor device which is one embodiment of the present invention for the integrated circuit which controls driving of the portable game machine, a highly reliable portable game machine and a portable game machine with low power consumption can be provided. Note that the portable game machine illustrated in FIG. 16A has the two display portions 7033 and 7034. However, the number of display portions included in a portable game machine is not limited thereto.

FIG. 16B illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to one embodiment of the present invention can also be used for an integrated circuit for controlling the driving of the mobile phone. With the use of the semiconductor device which is one embodiment of the present invention for the integrated circuit which controls driving of the mobile phone, a highly reliable mobile phone and a mobile phone with low power consumption can be provided.

FIG. 16C is a portable information terminal which includes a housing 7051, a display portion 7052, an operation key 7053, and the like. In the portable information terminal illustrated in FIG. 16C, a modem may be incorporated in the housing 7051. The semiconductor device according to one embodiment of the present invention can also be used for an integrated circuit for controlling the driving of the portable information terminal. With the use of the semiconductor device which is one embodiment of the present invention for the integrated circuit which controls driving of the portable information terminal, a highly reliable portable information terminal and a portable information terminal with low power consumption can be provided.

This embodiment can be implemented by being combined as appropriate with any of the above-described embodiments.

This application is based on Japanese Patent Application serial no. 2010-060393 filed with Japan Patent Office on Mar. 17, 2010, the entire contents of which are hereby incorporated by reference.

The invention claimed is:

1. A semiconductor device comprising:
a control circuit;
a first reading circuit operationally connected to the control circuit;
a first memory portion operationally connected to the control circuit and the first reading circuit, the first memory portion including a first memory element;
a second reading circuit operationally connected to the control circuit;
a second memory portion operationally connected to the control circuit and the second reading circuit, the second memory portion including a first transistor and a second memory element; and
a comparison circuit operationally connected to the first reading circuit and the second reading circuit,
wherein the first transistor includes an oxide semiconductor in a channel formation region.

2. The semiconductor device according to claim 1,
wherein the first memory element is capable of storing first data by writing of reference data;
wherein the second memory element is capable of storing second data by writing of the reference data; and
wherein the comparison circuit is configured to compare the first data with the second data.

3. The semiconductor device according to claim 2, wherein the second memory element is capable of storing third data including a result of the comparison of the first data and the second data.

4. The semiconductor device according to claim 1 further comprising a second transistor in the second memory element.

5. The semiconductor device according to claim 4, wherein the second transistor includes an oxide semiconductor in a channel formation region.

6. The semiconductor device according to claim 1, wherein the oxide semiconductor comprises indium, gallium and zinc.

7. The semiconductor device according to claim 2, wherein hydrogen concentration of the channel formation region is lower than or equal to $5 \times 10^{19}/\text{cm}^3$.

8. The semiconductor device according to claim 2, wherein an off-state current density of the first transistor is lower than or equal to 100 zA/μm.

9. The semiconductor device according to claim 1, further comprising:
a first data line driver circuit operationally connected to the control circuit;
a first word line driver circuit operationally connected to the control circuit;
a second data line driver circuit operationally connected to the control circuit; and
a second word line driver circuit operationally connected to the control circuit.

10. The semiconductor device according to claim 1, wherein the first memory element is a substantially nonvolatile memory element.

11. The semiconductor device according to claim 10, wherein the first memory element comprises a third transistor which includes a floating gate between a gate electrode and an active layer.

12. A semiconductor device comprising:
a control circuit;
a first reading circuit operationally connected to the control circuit;
a first memory portion operationally connected to the control circuit and the first reading circuit, the first memory portion including a first memory element;
a second reading circuit operationally connected to the control circuit;
a second memory portion operationally connected to the control circuit and the second reading circuit, the second memory portion including a first transistor and a second memory element; and
a comparison circuit operationally connected to the first reading circuit and the second reading circuit,
wherein the first transistor includes an oxide semiconductor in a channel formation region,
wherein the first memory element includes a second transistor, and
wherein the second transistor includes silicon in a channel formation region.

13. The semiconductor device according to claim 12,
wherein the first memory element is capable of storing first data by writing of reference data;
wherein the second memory element is capable of storing second data by writing of the reference data; and
wherein the comparison circuit is configured to compare the first data with the second data.

14. The semiconductor device according to claim 13, wherein the second memory element is capable of storing third data including a result of the comparison of the first data and the second data.

15. The semiconductor device according to claim 12 further comprising a third transistor in the second memory element.

16. The semiconductor device according to claim 15, wherein the third transistor includes an oxide semiconductor in a channel formation region.

17. The semiconductor device according to claim 12, wherein the oxide semiconductor comprises indium, gallium and zinc.

18. The semiconductor device according to claim 12, wherein hydrogen concentration of the channel formation region is lower than or equal to $5 \times 10^{19}/cm^3$.

19. The semiconductor device according to claim 12, wherein an off-state current density of the first transistor is lower than or equal to 100 zA/μm.

20. The semiconductor device according to claim 12, further comprising:
a first data line driver circuit operationally connected to the control circuit;
a first word line driver circuit operationally connected to the control circuit;
a second data line driver circuit operationally connected to the control circuit; and
a second word line driver circuit operationally connected to the control circuit.

21. The semiconductor device according to claim 12, wherein the first memory element is a substantially nonvolatile memory element.

22. The semiconductor device according to claim 21, wherein the first memory element comprises a fourth transistor which includes a floating gate between a gate electrode and an active layer.

* * * * *

UNITED STATES PATENT AND TRADEMARK OFFICE
CERTIFICATE OF CORRECTION

PATENT NO. : 8,711,623 B2  
APPLICATION NO. : 13/848871  
DATED : April 29, 2014  
INVENTOR(S) : Toshihiko Saito and Shuhei Nagatsuka Page 1 of 1

It is certified that error appears in the above-identified patent and that said Letters Patent is hereby corrected as shown below:

Title Page, item (73), replace "Semicondoctor" with --Semiconductor--;

In the Claims

Column 34, line 24, in claim 7, after "claim" replace "2" with --1--;

Column 34, line 27, in claim 8, after "claim" replace "2" with --1--.

Signed and Sealed this
Sixth Day of January, 2015

Michelle K. Lee
*Deputy Director of the United States Patent and Trademark Office*